US006061398A

United States Patent [19]
Satoh et al.

[11] Patent Number: 6,061,398
[45] Date of Patent: May 9, 2000

[54] METHOD OF AND APPARATUS FOR COMPRESSING AND RESTORING DATA

[75] Inventors: Noriko Satoh; Yoshiyuki Okada; Shigeru Yoshida, all of Kawasaki, Japan

[73] Assignee: Fujitsu Limited, Kawasaki, Japan

[21] Appl. No.: 08/749,330

[22] Filed: Nov. 14, 1996

[30] Foreign Application Priority Data

Mar. 11, 1996 [JP] Japan ................................. 8-053482

[51] Int. Cl.⁷ ...................................................... H04B 1/66
[52] U.S. Cl. ............................... 375/240; 341/65; 341/67
[58] Field of Search ................................... 375/240, 241, 375/253; 341/65–67, 50, 51, 64; 358/426, 261.1, 261.2, 427

[56] References Cited

U.S. PATENT DOCUMENTS

| | | | |
|---|---|---|---|
| 5,548,338 | 8/1996 | Ellis et al. ................................. | 348/906 |
| 5,680,129 | 10/1997 | Weinberger et al. ...................... | 341/65 |
| 5,710,719 | 1/1998 | Houle .................................. | 364/514 R |
| 5,796,356 | 8/1998 | Okada et al. .............................. | 341/51 |

OTHER PUBLICATIONS

Alistair Moffat, et al., "Arithmetic Coding Revisited (Extended Abstract)" 1995, IEEE 1068–0314/95, pp. 202–211.

John C. Cleary, et al., "Unbounded Length Contexts for PPM", 1995 IEEE 1068–0314/95, pp. 52–61.

Donald E. Knuth, "Dynamic Huffman Coding", Journal of Algorithms (1985) 0196–6774/85, pp. 163–180.

*Primary Examiner*—Wellington Chin
*Assistant Examiner*—Congvan Tran
*Attorney, Agent, or Firm*—Staas & Halsey LLP

[57] ABSTRACT

A data compression apparatus is capable of compressing data at a high compression rate and at a high speed. A data decompression apparatus is used in combination with this data compression apparatus to decode the compressed data. The data compression apparatus includes a RAM which stores Huffman code trees each of which corresponds to a character string, i.e. "context." A CPU encodes each character which is to be encoded by use of a Huffman code tree corresponding to the context at that time. Each time a character is encoded, the Huffman code tree used is reconstructed so as to account for the encoded character. The data decompression apparatus stores Huffman code trees corresponding to contexts respectively, decodes the code to be decoded by use of a Huffman code tree corresponding to the context (a character string previously decoded). Each time one character is decoded, the Huffman code tree used for decoding is reconstructed so as to account for the decoded character.

24 Claims, 23 Drawing Sheets

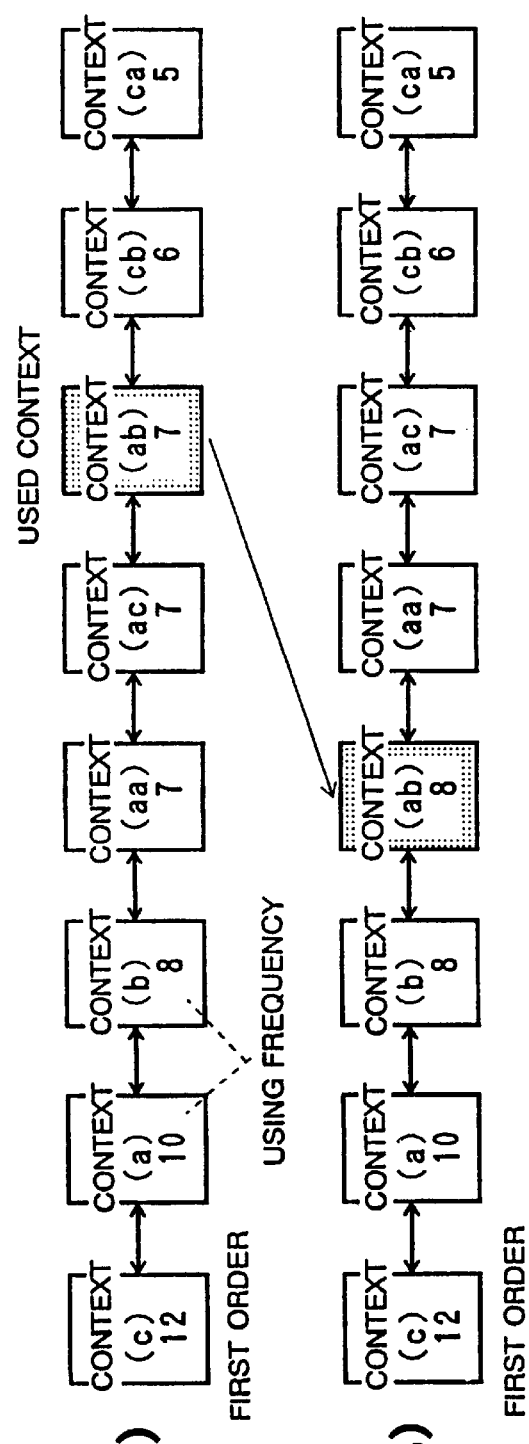

| CHARACTER | OCCURRENCE PROBABILITY | INTERVAL |
|---|---|---|
| a | 0.20 | [0, 0.2) |
| b | 0.10 | [0.2, 0.3) |
| c | 0.05 | [0.3, 0.35) |
| d | 0.15 | [0.35, 0.5) |
| e | 0.50 | [0.5, 1) |

INTERVAL OF abe
[0.05, 0.06)

METHOD OF AND APPARATUS FOR COMPRESSING AND RESTORING DATA

BACKGROUND OF THE INVENTION

1. Field of the Invention

The present invention relates generally to a data compression/decompression method of encoding data in a variety of forms and decoding the compressed data, and also to a data encoding apparatus and a data decoding apparatus. The present invention relates more particularly to a data compression/decompression method, a data encoding apparatus, and a data decoding apparatus for encoding and decoding data based on a statistical compression method.

2. Description of the Related Art

With a fast advancement of computers in recent years, a large capacity of data are treated in the computer, and it is a practice that the data are compressed in order to reduce a transmission time and efficiently use a storage unit.

A variety of coding methods are used for compressing the data. A particular coding method, known as a universal coding method, is applicable to various items of data without limiting the data to particular items such as character codes, vector data and images. A known type of universal coding is dictionary-based codings, which makes use of a similarity between the character strings and a statistical coding. The statistical coding translates each character's probability to a sequence of bits. Note that in the following discussion one unit of the data is expressed as a "character", and a plurality of "characters" connected to each other is expressed as a "character string".

The standard coding of a statistical coding may be Huffman coding and arithmetic coding. Before going into a detailed description of the Huffman coding, a code tree (defined as a data structure) used when generating the Huffman codes will be explained.

FIG. 21 illustrates one example of a code tree. Nodes are points marked with a circle (○) and a square (□). A line segment connecting the nodes is called a "branch". The node located in the highest position is called a "root". Further, an under node Y connected via the "branch" to a certain node X is termed a "child" of the node X. Reversely, the node X is referred to as a "parent" of the node Y. A node having no "child" is called a "leaf", and a particular character corresponds to each "leaf". Further, the nodes excluding the "leaves" are referred to as "internal nodes", and the number of "branches" from the "root" down to each "node" is called a level.

When encoded by use of the code tree, a path extending from the "root" down to a target "leaf" (corresponding to a character to be encoded) is outputted as a code. More specifically, "1" is outputted when branching off to the left from each of the nodes from the "root" down to a target "leaf", while "0" is outputted when branching off to the right. For instance, in the code tree illustrated in FIG. 21, a code "00" is outputted for a character A corresponding to a "leaf" of a node number 7, and a code "011" is outputted for a character B corresponding to a "leaf" of a node number 8.

When decoded, a character is outputted which corresponds to a "leaf" which is reached by tracing the respective nodes from the "root" in accordance with a value of each bit of code defined as a target for decoding.

According to the Huffman coding, the above-described code tree is generated by the following procedures (called a Huffman algorithm).

(1) Leaves (nodes) corresponding to the individual characters are prepared, and the frequency of occurrence of the characters corresponding to the respective leaves are recorded.

(2) One new node is created for two nodes having the minimum occurrence frequency, and this created node is connected via branches to the two nodes. Further, a sum of the occurrence frequencies of the two nodes connected via the branches is recorded as an occurrence frequency of the newly created node.

(3) The processing set forth in item (2) is executed for the remaining nodes, i.e. the nodes not having parents, until the number of remaining nodes becomes 1.

In the code tree generated by such procedures, it follows that a code is allocated to each character with a code length which is inversely proportional to the occurrence frequency of the character. Therefore, when the coding is performed by use of the code tree, it follows that the data can be compressed.

The coding using the Huffman codes is further classified into static coding, semi-adaptive coding, and adaptive coding.

According to the static coding, normally, the occurrence frequency of each character appearing within the data to be encoded is first counted and the code tree is created based on the counted occurrence frequency in the above-described procedures. Next, the relevant data is encoded by use of the code tree, and an encoded result is outputted as a piece of encoded data together with data representing a configuration of the code tree. That is, code trees having leaves which correspond to the characters to be encoded are prepared according to the static coding and the coding is then executed using those code trees. Then, on the decoding side, decoding is carried out by use of the code trees outputted together with the codes.

According to semi-adaptive coding, as in the case of the static coding the code trees having the leaves relative to all of the characters to be encoded are prepared. However, the code tree prepared first is generated by setting respective proper initial values to the occurrence frequencies of the individual characters. In the semi-adaptive coding, the code tree is modified to assume a configuration corresponding to the occurrence frequency of each character that changes corresponding to the input data.

As explained above, there must be prepared code trees having the leaves relative to all the characters to be encoded in the static coding and the semi-adaptive coding as well. In contrast, when adaptively encoded, code trees are prepared in which all characters do not have corresponding leaves, i.e., the code trees only have leaves which are relative to some characters and non-registered characters. According to the adaptive coding, if the leaves pertaining to the characters to be encoded do not exist in the code trees, there are outputted the codes for the non-registered characters and the characters themselves (or the codes into which these characters are encoded based on a predetermined coding rule). Thereafter, the leaves relative to those characters are added to the code trees.

Note that the code tree is normally formed so that an FGK (Faller-Gallager-Knuth) algorithm can be applied to update the configuration of the code tree because the updating is performed frequently in the semi-adaptive coding and the adaptive coding. That is, as illustrated in FIG. 22, the code tree is formed so that the occurrence frequency to be recorded gets larger at lower levels and that the occurrence frequency becomes larger at more leftward nodes with respect to the nodes at the same level.

According to the Huffman coding, when encoding one character, a code consisting of an integral number of bits is generated. In contrast, according to the arithmetic coding, bits of fractions can be allocated to one character. According to the arithmetic coding, a number line that is 0 or larger but less than 1 (which is hereinafter represented such as [0, 1)) is sequentially narrowed in accordance with an occurrence probability (occurrence frequency) of each character constituting the data that should be encoded. Then, when finishing the processes for all characters, a numerical value representing one point within a narrowed interval is outputted as a code.

For example, there are five characters a, b, c, d and e as encoding targets, and occurrence probabilities of these characters are 0.2, 0.1, 0.05, 0.15 and 0.5, respectively. In this case, as shown in FIG. 23, an interval having an interval width corresponding to its occurrence probability is allocated to each character. Then, if a character string to be encoded is "abe", as schematically shown in FIG. 24, to start with, an interval [0, 1) is narrowed down to an interval [0, 0.2) for the character "a". Next, this interval [0, 0.2) is segmented into intervals corresponding to the occurrence probabilities of the respective characters, and an interval [0.04, 0.06) corresponding to the next character "b" is selected as an interval of a character string "ab". Then, this interval [0.04, 0.06) is further segmented into intervals corresponding to the occurrence probabilities of the respective characters, and an interval [0.05, 0.06) corresponding to the next character "e" is selected as an interval of the character string "abe". Outputted thereafter as an encoded result is a bit string under a decimal point when a position of an arbitrary point, e.g., a lower limit within that interval, is binary-displayed.

According to the arithmetic coding, it is also practiced that the occurrence probability of each subject character is obtained while being made to correspond to the character string (context) occurring just anterior to the subject character in order to further enhance a compression effect. In this case, the coding is, as schematically illustrated in FIG. 25, attained by an apparatus including a context modeling unit and a statistical coder. The context modeling unit, as illustrated in FIG. 26, stores the occurred character strings and counts the number of occurrences by use of the context tree as shown in FIG. 26, thus obtaining a probability depend on the preceding symbol (character). The statistical coder generates a code having a length corresponding to the probability obtained by the context modeling unit. Note that the statistical coder uses the probability before being updated when generating the code.

For instance, as schematically shown in FIG. 27, if source data with characters arranged in a sequence such as "abc" is inputted, the context modeling unit outputs to the statistical coder a probability p (c_ a, b) at which "c" defined as a coding target character occurs subsequent to "ab" defined as a context. Thereafter, the context collecting unit recalculates the conditional probability of each character on the basis of the fact that "c" again occurs subsequent to "ab".

Known are a variety of processing procedures concrete in the context collecting process. Such procedures are roughly classified into a type of "fixing a degree of context" (the number of characters of the context) and a "non-fixed" type (Blending context). According to the latter method, if a certain context is likely to occur, the degree of that context is increased. Whereas if a certain context is unlikely to occur, the degree remains low. Thus, the degree of each context changes adaptively to the input data.

The Huffman coding has, though capable of compressing data at a high velocity, such a defect that a high compression rate can not be obtained in the case of the ordinary data being a target. In contrast, according to the arithmetic coding that makes use of a context model, the high compression rate can be attained. However, a complicated calculation is required for performing the compression, and hence there exists such a defect that the data can not be compressed fast. Further, the data compression rate can be enhanced as a higher degree context model is employed. It, however, follows that a large storage capacity is needed for storing the data on the respective contexts. For this reason, the prior art data compression apparatus is, as a matter of fact, capable of doing nothing but preparing data about a limited number of contexts and is therefore incapable of sufficiently drawing the performance of the context model.

SUMMARY OF THE INVENTION

It is therefore a primary object of the present invention to provide a data compression apparatus capable of attaining a high compression rate at a practical processing speed.

It is another object of the present invention to provide a data decompression apparatus capable of restoring the data compressed by the data compression apparatus.

To accomplish the objects given above, according to a first aspect of the invention, a data compression/decompression method of compressing or restoring data according to the present invention, comprising a step of reading source data from a machine readable memory, and obtaining a Huffman code tree for compressing the source data with a model that predicts probability of a character to be encoded on the basis of a few immediately preceding characters in the source data.

According to a second aspect of the invention, a first data compression apparatus according to the present invention comprises a storage unit for storing contexts and code trees according to a Huffman code rule, each of the code trees is related to a context. The data compression apparatus also comprises a input unit for inputting a character string to be compressed, a character obtaining unit for obtaining a character to be encoded from the character string, a context specifying unit for specifying a context that occurs just preceding (anterior) to the character obtained by the character obtaining unit. The data compression apparatus further comprises a code outputting unit for outputting a code made corresponding to the character obtained by the character obtaining unit in the code tree stored in the storage unit with respect to the context specified by the context specifying unit, and an updating unit for updating the code tree used by the code outputting unit in accordance with the Huffman code rule.

That is, the first data compression apparatus makes the data compression proceed in a semi-adaptive manner in such a form that a context model is applied to the Huffman coding. Therefore, it follows that the first data compression apparatus is capable of compressing the data at a high compression rate and at a high velocity.

A second data compression apparatus according to the present invention is constructed by modifying the first data compression apparatus. To start with, there is used code trees containing a special code 'escape' which is transmitted to signal a decoder to shorter the context. Further, the code outputting unit, if the data relative to the character obtained by the character obtaining unit does not exist in the code tree stored in the storage unit with respect to the context specified by the context specifying unit, outputs a special code made corresponding to the special character 'escape' within the code tree and repeats the outputting of the special code while shortening the context specified by the context specifying unit until the code for the character obtained by the character obtaining unit is outputted. Further provided is an adding unit for adding data about unregistered combinations of character and contexts to the storage unit when the code outputting unit outputs the special code.

The thus constructed second data compression apparatus is capable of attaining a much higher compression rate because of the data being compressed adaptively.

A third data compression apparatus according to the present invention is constructed by adding to the second data compression apparatus, a using frequency managing unit for managing a using frequency of each contexts (the code trees) by the code outputting unit, and a deleting unit for deleting data about a context with a minimum using frequency out of the storage unit.

A fourth data compression apparatus according to the present invention is constructed by adding, to the second data compression apparatus, a degree managing unit for managing degrees by imparting a degree to each context and, when the code outputting unit outputs the code, imparting a higher degree to the context used for outputting the code, and a deleting unit for deleting data about a context to which a lowest degree is imparted from within the storage unit.

A fifth data coding apparatus according to the present invention is constructed by using, in the fourth data compression apparatus, the degree managing unit which imparts the first degree to the context used for the code outputting unit.

A sixth data coding apparatus according to the present invention is constructed by using, in the fourth data compression apparatus, the degree managing unit which imparts an degree higher by one to he context used for the code outputting unit.

The thus constructed fourth through sixth data compression apparatuses are capable of attaining the data compression at the high compression rate even when the storage unit does not have a large capacity.

According to a third aspect of the invention, a seventh data compression apparatus according to the present invention comprises a storage unit for storing code trees according to a Huffman code rule and an occurrence frequency table each of the code trees and the occurrence frequency table is related to a context, and a character obtaining unit for obtaining a character to be encoded from a character string that should be compressed. The seventh data compression apparatus also comprises a context specifying unit for specifying a context that occurs just anterior to the character obtained by the character obtaining unit, a first code outputting unit for outputting, if data stored in the storage unit for the context specified by the context specifying unit is a code tree, a code made corresponding to the character obtained by the character obtaining unit in that code tree, and a first updating unit for updating the code tree used by the first code outputting unit in accordance with the Huffman code rule. The seventh data compression apparatus further comprises a second code outputting unit for outputting, if data stored in the storage unit for the context specified by the context specifying unit is the occurrence frequency table, an arithmetic code of the character obtained by the character obtaining unit on the basis of the occurrence frequency relative to each character in that item of occurrence frequency data, and a second updating unit for increasing the occurrence frequency relative to the character obtained by the character obtaining unit within the occurrence frequency data used by the second code outputting unit.

That is, the seventh data compression apparatus makes the data compression proceed in the semi-adaptive manner in such a form that the Huffman coding and the arithmetic coding are employed in combination. The seventh data compression apparatus is therefore capable of compressing the data by making use of the above two coding methods.

An eighth data compression apparatus according to the present invention is constructed such that the storage unit of the seventh data compression apparatus is stored with the code tree for such a context that the divergence of each character's probability from multiplication of ½ is small, and the occurrence frequency table for such a context that the divergence of each character's probability from multiplication of ½ is big.

A ninth data compression apparatus according to the present invention is constructed such that the storage unit of the seventh data compression apparatus is stored with the code tree for such a context that an order is less than a predetermined value, and the occurrence frequency table for such a context that the order is the predetermined value or larger.

A tenth data compression apparatus according to the present invention is constructed such that the storage unit of the seventh data compression apparatus is stored with the code tree made corresponding to such a context that a predetermined or larger number of characters occur following the context, and the occurrence frequency data made corresponding to such a context that a less than the predetermined number of characters occur.

Note that a unit for outputting a fraction of the arithmetic code as a theretofore encoded result when the first code outputting unit outputs the code should be, it is desirable, used as the second outputting unit of the seventh through tenth data compression apparatuses according to the present invention.

Added further to the seventh data compression apparatus according to the present invention is a code storage unit having first and second storage areas stored with the codes as compressed results. The first code outputting unit may involve the use of a unit for writing the code to the first storage area within the code storage unit, and the second code outputting unit may involve the use of a unit for writing the code to the second storage area within the code storage unit.

Added moreover to the seventh data compression apparatus according to the present invention are a code storage unit having a storage area of a predetermined size, stored with the code as a compressed result, and a code outputting unit for outputting the code stored in the storage unit when the code storage unit is incapable of storing a new code. The first code outputting unit may involve the use of a unit for writing the codes to the storage area within the code storage unit from a front part thereof, and the second code outputting unit may involve the use of writing the codes to the storage area within the code storage unit from a rear part thereof.

As described above, in the case of modifying the seventh through tenth data compression apparatuses, the number of times with which the fraction area must be discarded is decreased when encoding one piece of data, and hence it follows that a high compression rate is obtained.

According to a fourth aspect of the invention, a first data decompression apparatus according to the present invention comprises a storage unit for storing contexts and code trees according to a Huffman code rule, each of which is related to a context, a context specifying unit for specifying a context to be used for restoring data. The first data decompression apparatus also comprises a character outputting unit for outputting a character made corresponding to the code in the code tree stored in the storage unit with respect to the context specified by the context specifying unit, and an updating unit for updating the code tree used by the character outputting unit in accordance with the Huffman code rule.

The first data decompression apparatus restores the data compressed by the first data compression apparatus.

A second data decompression apparatus according to the present invention is constructed by modifying the first data decompression apparatus in the following manner. First of all, each of the code trees may involve a special code 'escape' Further, the character outputting unit may involve the use of a unit for, if the code is the special code in the code tree, repeating the restoration while short character context until the character is restored. Added then is a registering unit for registering the storage unit with data about a unregistered combination of contexts and character.

The second data decompression apparatus restores the data compressed by the second data compression apparatus.

A third data decompression apparatus according to the present invention is constructed by adding, to the second data decompression apparatus, a using frequency managing unit for managing a using frequency of each context by the character outputting unit, and a deleting unit for deleting data about a context with a minimum using frequency out of the storage unit.

The third data decompression apparatus restores the data compressed by the third data compression apparatus.

A fourth data decompression apparatus according to the present invention is constructed by add, to the third data decompression apparatus, a degree managing unit for managing degrees by imparting a degree to each context and, when the character outputting unit outputs the character, imparting a higher degree to the context used for outputting the character and a deleting unit which deletes data about a context to which a lowest degree is imparted from within the storage unit.

The fourth data decompression apparatus restores the data compressed by the fourth data compression apparatus.

A fifth data decompression apparatus according to the present invention is constructed by adopting, in the fourth data decompression apparatus, the degree managing unit for imparting the first degree to the context used for the code outputting unit.

The fifth data decompression apparatus restores the data compressed by the fifth data compression apparatus.

A sixth data decompression apparatus according to the present invention is constructed by adopting, in the fourth data decompression apparatus, the degree managing unit for imparting the degree higher by one to the context used for the code outputting unit.

The sixth data decompression apparatus restores the data compressed by the sixth data compression apparatus.

According to a fifth aspect of the invention, a seventh data decompression apparatus according to the present invention, comprises a storage unit for storing code trees according to a Huffman code rule and an occurrence frequency table which consisting of occurrence frequencies of respective characters, each of the code trees and the occurrence frequency data is related to a context, and a context specifying unit for specifying a context used for decoding. The seventh data decompression apparatus also comprises a first character outputting unit for outputting, if data stored in the storage unit for the context specified by the context specifying unit is a code tree, a character made corresponding to the code in that code tree, and an updating unit for updating the code tree used by the first character outputting unit in accordance with the Huffman code rule. The seventh data decompression apparatus further comprises a second character outputting unit for performing, if data stored in the storage unit for the context specified by the context specifying unit is occurrence frequency table, arithmetic decoding of the code that uses the occurrence frequency data and outputting the character obtained as a decoded result, and a second occurrence frequency increasing unit for increasing the occurrence frequency relative to the outputted character in the occurrence frequency table.

The seventh data decompression apparatus restores the data compressed by the seventh data compression apparatus.

An eighth data decompression apparatus according to the present invention is constructed such that the storage unit of the seventh data decompression apparatus is stored with the code tree stored for such a context that divergence of each character's probability from multiplication of ½ is small, and the occurrence frequency table for such a context that divergence of each character's probability from multiplication of ½ is big.

The eighth data decompression apparatus restores the data compressed by the eighth data compression apparatus.

A ninth data decompression apparatus according to the present invention is constructed such that the storage unit of the seventh data decompression apparatus is stored with the code tree for such a context that a the number of characters is less than a predetermined value, and the occurrence frequency table for such a context that the number of characters is the predetermined value or under.

The ninth data decompression apparatus restores the data compressed by the ninth data compression apparatus.

A tenth data decompression apparatus according to the present invention is constructed such that the storage unit of the seventh data decompression apparatus is stored with the code tree made corresponding to such a context that a predetermined or larger number of characters occur, and the occurrence frequency data made corresponding to such a context that a less than the predetermined number of characters occur.

The tenth data decompression apparatus restores the data compressed by the tenth data compression apparatus.

Note that the second character outputting unit of the seventh data decompression apparatuses of the present invention may involve the use of an unit for removing, when the first character outputting unit performs the decoding, fractions of the theretofore arithmetic codes.

Further, a code storage unit having first and second storage areas stored with the codes to be restored may be added to the seventh through tenth data decompression apparatuses according to the present invention. The first character outputting unit may involve the use of a unit for restoring the code stored in the first storage area within the code storage unit, and the second character outputting unit may involve the use of a unit for restoring the code stored in the second storage area within the code storage unit.

Added moreover to the seventh data decompression apparatuses according to the present invention are a code storage unit having a storage area of a predetermined size, stored with the code as a compressed result, and a code inputting unit for inputting a new code into the code storage unit when there is no code to be decoded within the code storage unit.

The first character outputting unit may involve the sue of a unit for decoding the codes from the front part of the storage area within the code storage unit, and the second character outputting unit may involve the use of a unit for decoding the codes from the rear part of the storage area within the code storage unit.

BRIEF DESCRIPTION OF THE DRAWINGS

Other objects and advantages of the present invention will become apparent during the following discussion in conjunction with the accompanying drawings, in which:

FIG. 11 is an explanatory diagram showing a processing procedure of the order changing process applicable to the data compressing apparatus in the third embodiment;

DETAILED DESCRIPTION OF THE PREFERRED EMBODIMENTS

The present invention will hereinafter be specifically discussed with reference to the accompanying drawings.
First Embodiment
<Data Compressing Apparatus>

Figure 1:
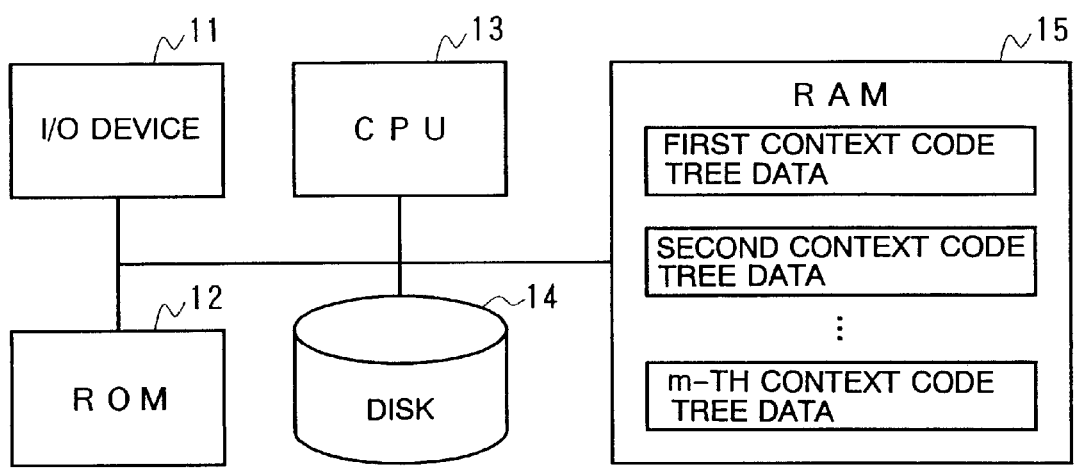
FIG. 1 is a block diagram illustrating a construction of a data compressing apparatus in a first embodiment of the present invention.

FIG. 1 illustrates a construction of a data compressing apparatus in a first embodiment. As shown in FIG. 1, the data compressing apparatus in the first embodiment is constructed mainly of an I/O unit 11, a ROM (Read-Only Memory) 12, a CPU (Central Processing Unit) 13, a disk storage unit 14 and a RAM (Random Access Memory) 5.

The I/O unit 11 comprises a keyboard, a CRT (Cathode Ray Tube) and peripheral units and is used to indicate data to be compressed. The ROM 12 is stored with a program that is executed at first by the CPU 13 when starting up the present apparatus. The CPU 13 down-loads, in accordance with the program, an operation system stored in the disk storage unit 14 into a predetermined storage area of the RAM 13; and further down-loads a program for compressing the data that operates on the operation system into another storage area of the RAM 15.

Then, the CPU 13 starts the operation based on the read-in data compression program and, prepares, within the RAM 15 as schematically shown in FIG. 1, pieces of code tree data on all second-order contexts that may be included in the original data to be compressed by the present data compressing apparatus. The code tree data is defined data representing a Huffman code tree having leaves for all the characters that might be included in the original data. The Huffman code tree, expressed by the code tree data prepared when started, assumes a configuration corresponding to an initial value of a frequency given to each character (leaf). In the present data compressing apparatus, every piece of code tree data within the RAM 15 is updated during progression of the data compression.

Figure 2:
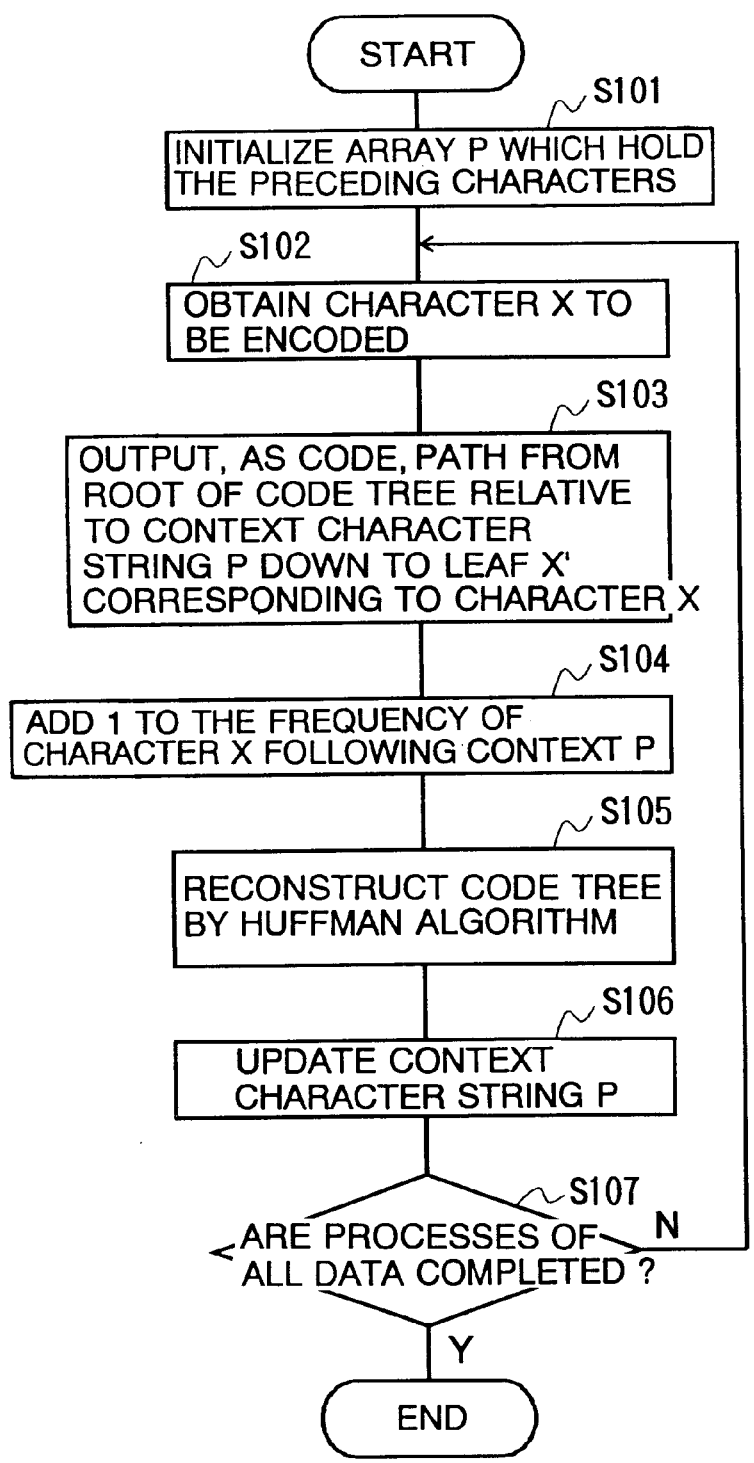
FIG. 2 is a flowchart showing operating procedures of the data compressing apparatus in the first embodiment of the present invention.

Operating procedures of the CPU 13 within the data compressing apparatus in the first embodiment will be hereinafter described with reference to FIG. 2.

When starting the data compression, the CPU 13 initializes a context character string P (array P for holding the preceding characters) by setting a representative character string such that the code tree data are prepared within the RAM 15 (step S101). The character string set in step S101 is used as data for designating the code tree data employed for encoding the first and second characters (where a second-order context does not actually exist) of the original data identical with the data to be compressed.

Subsequently, the CPU 13 obtains a character X (subsequent to the context character string P) that should be encoded out of the original data (step S102). The CPU 13 then outputs, as a code, a path extending from a root of the code tree (defined by the code tree data corresponding to the context character string P) down to a leaf X' corresponding to the character X (step S103). Thereafter, the CPU 13 adds "1" to an occurrence frequency of the character X in the code tree data used for outputting the code (step S104). The CPU 13 then reconstructs the code tree in accordance with the Huffman algorithm on the basis of the occurrence frequency of each character and updates a content of the code tree data so as to express the code tree after being reconstructed (step S105).

Then, the CPU 13 updates the context character string P by use of the character X so that the content of the context character string P becomes a context of the next character (step S106). That is, the CPU 13 adds the completely encoded character X to a tail of the context character string P defined as a 2-character string, and generates a new context string P of two characters by eliminating a head one character.

Thereafter, the CPU 13 judges whether or not processes for all the characters in the original data are completed. If not completed, (step S107; N), the CPU 13 returns to step S102, wherein the next character is to be encoded. Then, when finishing the processes pertaining to all the characters in the original data (step S107; Y), the CPU 13 finishes the data compressing processes for the original data.

Thus, the data compressing apparatus in the first embodiment compresses the data while updating the configuration of the Huffman code tree prepared for every context in accordance with the content of the original data. Therefore, the present data compressing apparatus is capable of attaining the data compression at a high speed at a high compression rate.

Note that the data compressing apparatus in the first embodiment is constructed by way of an apparatus using the second-order context but may be, as a matter of course, constructed to use the contexts of other orders.

<Data Restoring Apparatus>

A data restoring apparatus in the first embodiment restores the data compressed by the data compressing apparatus in the first embodiment.

A construction of the data restoring apparatus in the first embodiment is the same as that of the data compressing apparatus in the first embodiment as illustrated in FIG. 1. When starting up the data restoring apparatus in the first embodiment, a RAM thereof is stored with absolutely the same code tree data as the code tree data prepared on the RAM of the data compressing apparatus in the first embodiment.

Figure 3:
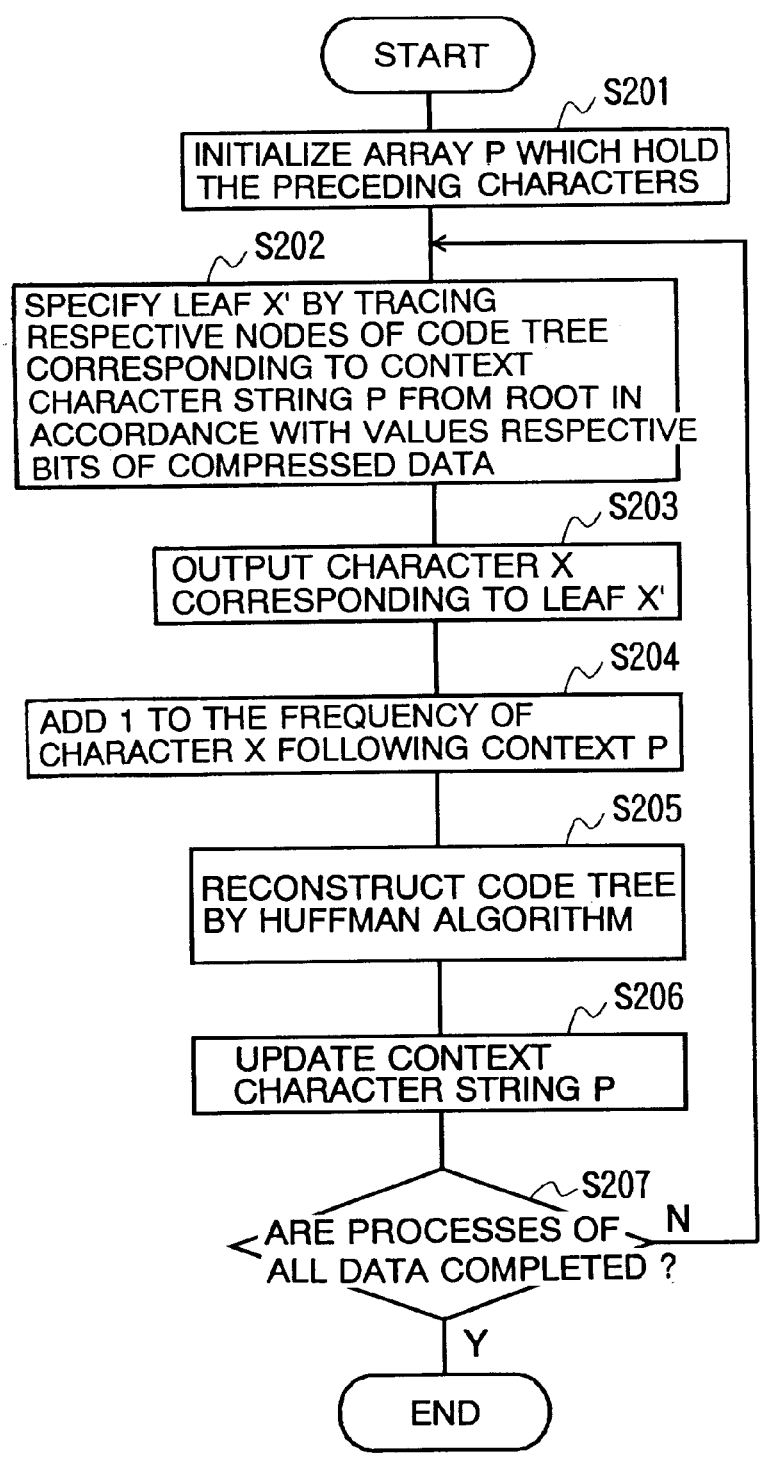
FIG. 3 is a flowchart showing operating procedures of a data restoring apparatus in the first embodiment of the present invention.

Operating procedures of a CPU 13 within the data restoring apparatus in the first embodiment will hereinafter be described with reference to FIG. 3.

At a start of restoring the compressed data, the CPU 13 first initializes the context character string P (step S201). Set in the context character string P in step S201 is the same character string as the character string used for initializing the context character string P in the data compressing apparatus according to the first embodiment.

Subsequently, the CPU 13 selects a piece of code tree data corresponding to the context character string P out of plural pieces of code tree data stored in the RAM. The CPU 13 traces the respective nodes within the code tree represented by the selected code tree data, from a root down to a leaf in accordance with values of respective bits constituting the compressed data to be restored, thus specifying one leaf X' (step S202). Then, the CPU 13 outputs a character X corresponding to the specified leaf X' as a result of the restoration (step S203).

Thereafter, the CPU 13 adds "1" to an occurrence frequency relative to the character X (the leaf X') in the used code tree data (step S204). Then, the code tree is reconstructed by use of the Huffman algorithm on the basis of the occurrence frequency relative to each character in that item of code tree data, and the content of the code tree data is updated so as to express the reconstructed code tree (step S205). Next, the CPU 13 updates the context character string P by use of the character X (step S206), and, if the processes for all the data are not yet finished (step S207; N), the CPU 13 returns to step S202 and starts restoring the next code.

Then, when completing the processing of the last bit in the compressed data (step S207; Y), the CPU 13 finishes the restoring process of the same compressed data.

Second Embodiment

<Data Compressing Apparatus>

The data compressing apparatus in a second embodiment, as in the same way with the data compressing apparatus in the first embodiment, compresses the data on all of the context fixed to the second-order. The data compressing apparatus in the second embodiment has the same construction as that of the data compressing apparatus (shown in FIG. 1) in the first embodiment. A RAM of the data compressing apparatus is, when started up, stored with pieces of code tree data taking a form, to which the FGK algorithm is applicable, assuming the same corresponding relationship between the codes, the characters and the code tree data stored in the RAM of the data compressing apparatus in the first embodiment.

Figure 4:
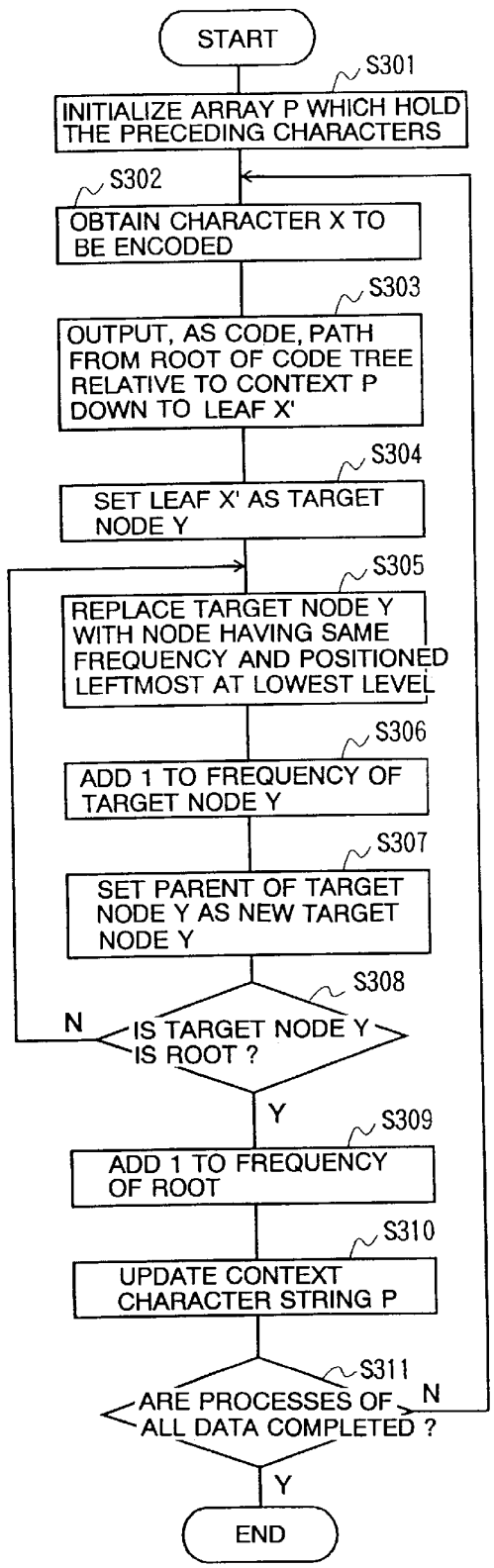
FIG. 4 is a flowchart showing operating procedures of the data compressing apparatus in a second embodiment of the present invention.

Operating procedures of the CPU 13 within the data compressing apparatus in the second embodiment will be hereinafter explained with reference to FIG. 4.

When starting the data compression, the CPU 13 first initializes the context character string P by setting a representative context character string such that the code tree data are prepared (step S301). Next, the CPU 13 obtains a character X subsequent to the context character string P (that should be encoded) out of the original data serving as a target for compression (step S302). Then, the CPU 13 selects a piece of code tree data corresponding to the context character string P and outputs, as a code, a path extending from the root down to a leaf X' corresponding to the character X in the code tree defined by the code tree data (step S303).

Thereafter, the CPU 13 executes processes (step S304–S309) according to the FGK algorithm in order to reflect the fact that the character X occurs in a configuration of the code tree.

That is, at the onset, the CPU 13 determines that the leaf X' is treated as a target node Y (step S304). Next, the target node Y is replaced with a node having the same frequency as that of the target node Y and having the minimum level. On this occasion, if there are two or more nodes having the same frequency as that of the target node Y at the same level, the target node Y must be replaced with the leftmost node (step S305).

Thereafter, the CPU 13 adds "1" to the frequency of the target node Y (step S306), and sets a parent of the target node Y as a new target node Y (step S307). Then, the CPU 13, if the new target node Y is not defined as a root (step S308; N), re-executes the processes starting from step S305. Further, the CPU 13 adds, when the target node Y becomes the root (step S308; Y), "1" to the frequency of the root (the target node Y) (step S309), and updating of the configuration of the code tree (the updating of the content of the code tree data) is thus finished.

After the content of a certain item of code tree data has been updated by such a series of processes, the CPU 13 updates the context character string P by use of the character X (step S310). If the processes for all the characters constituting the original data are not yet finished (step S311; N), the CPU 13 returns to step S302 and starts encoding the next character.

Then, the CPU 13, when completing the processes for all the characters (step S311; Y), finishes compressing the original data.

As discussed above, the data compressing apparatus in the second embodiment updates the configuration of the code tree by use of the FGK algorithm. The data compressing apparatus in the second embodiment is therefore capable of executing the data compression at a higher velocity than by the data compressing apparatus in the first embodiment.

<Data Restoring Apparatus>

A data restoring apparatus in the second embodiment restores the data compressed by the data compressing apparatus in the second or first embodiment. When starting up the data restoring apparatus in the second embodiment, a RAM thereof is stored with absolutely the same code tree data as the code tree data prepared in the RAM of the data compressing apparatus in the second embodiment.

Figure 5:
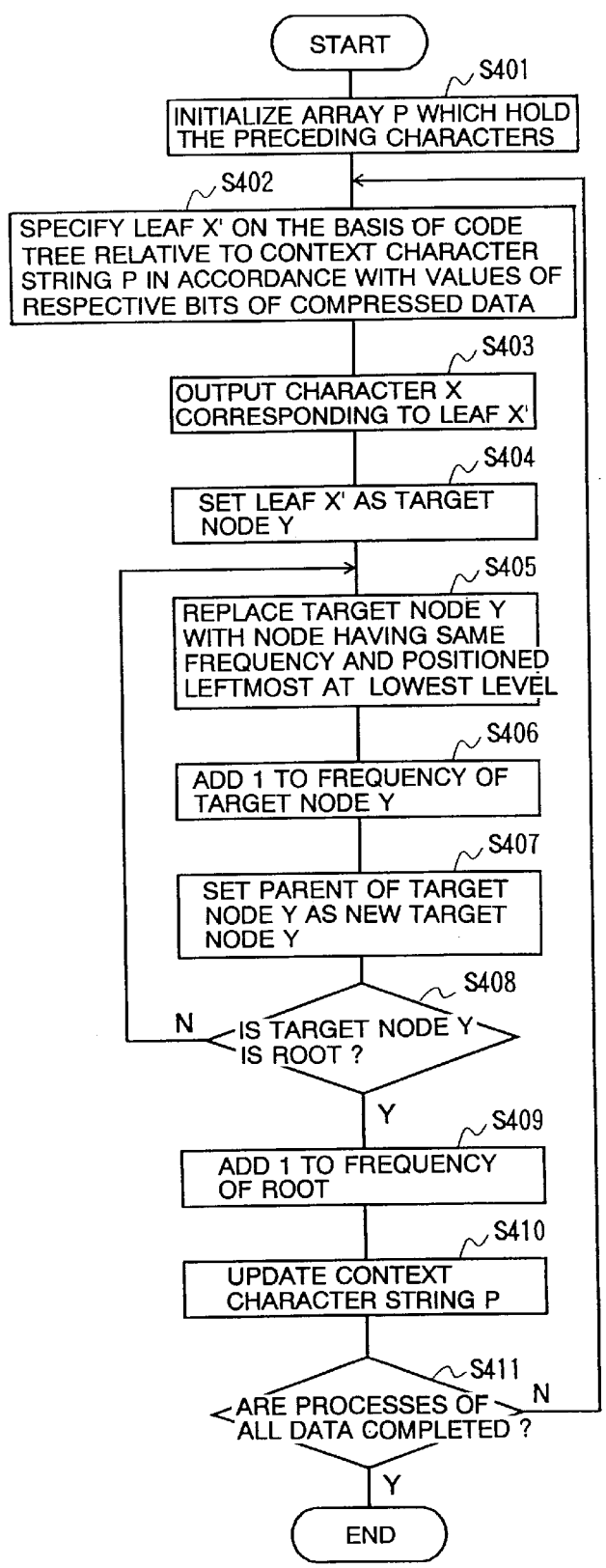
FIG. 5 is a flowchart showing operating procedures of the data restoring apparatus in a second embodiment of the present invention.

Operating procedures of the CPU 13 within the data restoring apparatus in the second embodiment will hereinafter be described with reference to FIG. 5.

When starting the restoration of a certain item of compressed data, the CPU 13 at first initializes the context character string P (step S401). Set in the context character string P in step S241 is the same character string as the character string used for initializing the context character string P in the data compressing apparatus according to the second embodiment.

Subsequently, the CPU 13 specifies a piece of code tree data corresponding to the context character string P. The CPU 13 traces the respective nodes within the code tree represented by the relevant code tree data, from a root down to a leaf in accordance with values of respective bits constituting the compressed data to be restored, thus specifying one leaf X' (step S402). Then, the CPU 13 outputs the character X corresponding to the specified leaf X' as a result of the restoration (step S403).

Thereafter, the CPU 13 executes processes (steps S404–S409) in accordance with the FGK algorithm.

That is, to start with, the CPU 13 determines that the leaf X' is treated as a target node Y (step S404). Next, the target node Y is replaced with a node having the same frequency as that of the target node Y and having the minimum level. On this occasion, if there are two or more nodes having the same frequency as that of the target node Y at the same level, the target node Y must be replaced with the leftmost node (step S405). Thereafter, the CPU 13 adds "1" to the frequency of the target node Y (step S406), and sets a parent of the target node Y as a new target node Y (step S407). Then, the CPU 13, if the new target node Y is not defined as a root (step S408; N), executes the processes starting from step S405. The CPU 13 adds, when the target node Y becomes the root (step S408; Y), "1" to the frequency of the root (the target node Y) (step S409), and updating of the configuration of the code tree (the updating of the content of the code tree data) is thus finished.

After the content of one item of code tree data has been updated by such a series of processes, the CPU 13 updates the context character string P by use of the character X (step S410). If the processes for all the bits constituting the compressed data are not yet finished (step S411; N), the CPU 13 returns to step S402 and continues to restore the compressed data.

Then, the CPU 13, when completing the processes for all the bits (step S411; Y), finishes the restoration thereof.

As discussed above, the data restoring apparatus in the second embodiment updates the configuration of the code tree by use of the FGK algorithm. The data restoring apparatus in the second embodiment is therefore capable of restoring the data at a higher velocity than by the data restoring apparatus in the first embodiment.

Third Embodiment

<Data Compressing Apparatus>

In the data compressing apparatus in a third embodiment, a first- or second-order context is additionally registered in accordance with a content of the data that should be compressed, and the data is thereafter compressed by use of the registered context.

Figure 6:
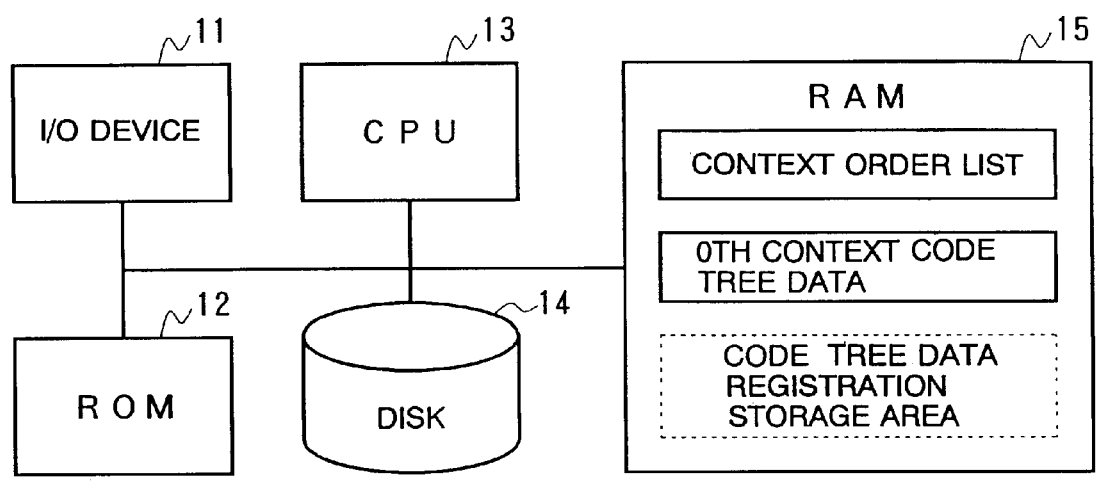
FIG. 6 is a block diagram showing a construction of the data compressing apparatus in the second embodiment of the present invention.

FIG. 6 illustrates a construction of the data compressing apparatus in the third embodiment. As shown in FIG. 6, when starting up the data compressing apparatus in the third embodiment, the RAM is stored with an item of code tree data concerning a context of a 0th order, a context order list and a storage area for registering the code tree data.

The code tree data relative to the 0th context is data for representing the Huffman code tree having leaves relative to all the characters that may occur in the original data, and takes a form to which the FGK algorithm can be applied. The storage area for registering the code tree data is a storage area for registering the code tree data on a new context. The context order list is a list for managing whether the code tree data relative to several contexts are registered in the storage area for registering the code tree data, and the context order list stored in the RAM 15 when started up has no content.

Operating procedures of the CPU 13 within the data compressing apparatus in the third embodiment will be hereinafter explained with reference to FIG. 7.

Figure 7:
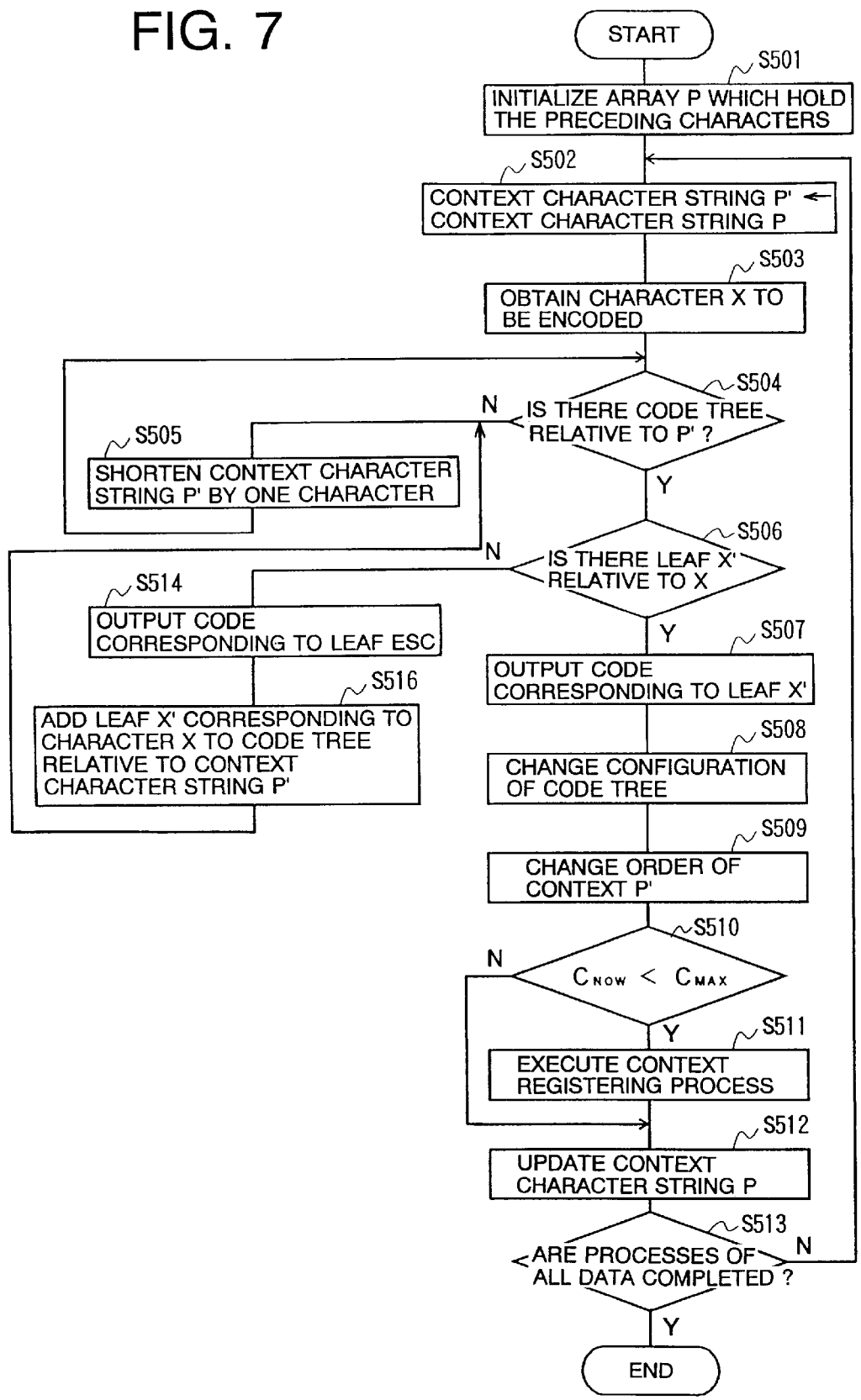
FIG. 7 is a flowchart showing operating procedures of the data compressing apparatus in a third embodiment of the present invention.

As shown in FIG. 7, when starting the data compression, the CPU 13 at first initializes the context character string P by setting a null character string (step S501). Next, the CPU 13 generates a context character string P' having the same content as that of the context character string P (step S502) and obtains a character X to be encoded (step S503).

Thereafter, the CPU 13 determines whether or not the code tree data on the context character string P' exists in the RAM (step S504). If the code tree data relative to the context character string P' does not exist (step S504; N), the CPU 13 sets, as a new context character string P', the character string from which one character at the head of the context character string P' is removed (step S505). Then, the CPU 13 returns to step S504 and checks whether the code tree data relative to the context character string P' exists or not.

As already explained, in the present data compressing apparatus, the code tree data on the 0th order context is held on the RAM. Therefore, the context character string P' including the code tree data can be invariably detected through a loop of steps S504 and S505.

The CPU 13, after detecting the context character string P', checks whether or not the data on the leaf corresponding to the character X exists in the code tree data corresponding to the context character string P' (step S506). Then, if the data on the leaf X' exists therein (step S506; Y), the character X is encoded by use of the code tree data, and an encoded result thereof is outputted (step S507). Subsequently, the CPU 13 updates the content of the code tree data so as to reflect the fact that the character X occurs, in the configuration of the code tree (step S508). Note that in step S508 the CPU 13 executes the same processes as steps S304–S309 shown in FIG. 4.

Thereafter, the CPU 13 updates the order of the used contexts (step S509). In step S509, the CPU 13 changes the order of the context used for outputting the code, to the maximum order, i.e., to the first order (degree). The CPU 13 then changes, down to orders lower by one, the orders of the respective contexts ranging from the context provided with the first order to the context provided with the order higher by one than the context used for outputting the code.

Figures 8A, 8B:
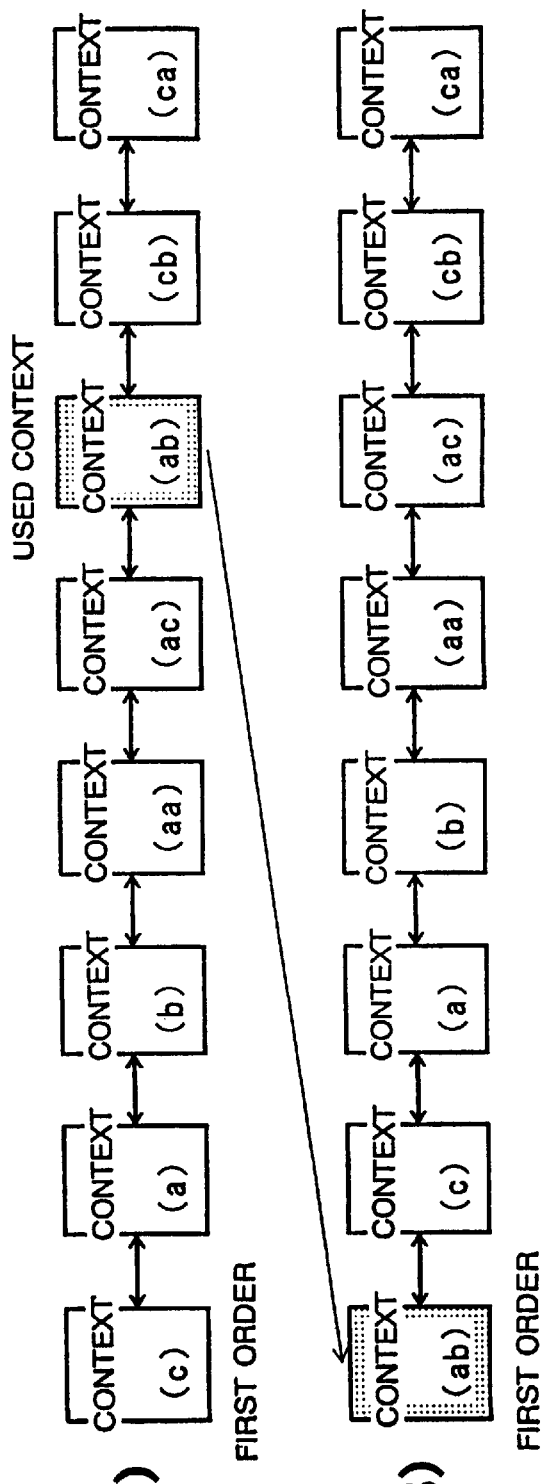
FIG. 8 is an explanatory diagram showing a processing procedure of an order changing process executed by the data compressing apparatus in the third embodiment.

For instance, as schematically shown in FIG. 8(A), the context order list is stored with the data about eight pieces contexts. When the code tree data relative to a context (ab) is used, the CPU 13, as shown in FIG. 8(B), the content of the context order list is changed so that an order of the context (ab) turns out to be the first order, and that the orders lower by one are given to the respective contexts provided with the first through fifth orders.

Thereafter, the CPU 13, if an order $C_{NOW}$ of the context P' is less than a maximum order $C_{MAX}$ ($C_{MAX}$=2 in the present apparatus) of the context (step S510; Y), executes a context registering process for registering the data relative to a context character P" (which is the context character string P' determined last time such that no code tree data exists in step S504) obtained by elongating the context character string P' by one character (step S511).

Figure 9:
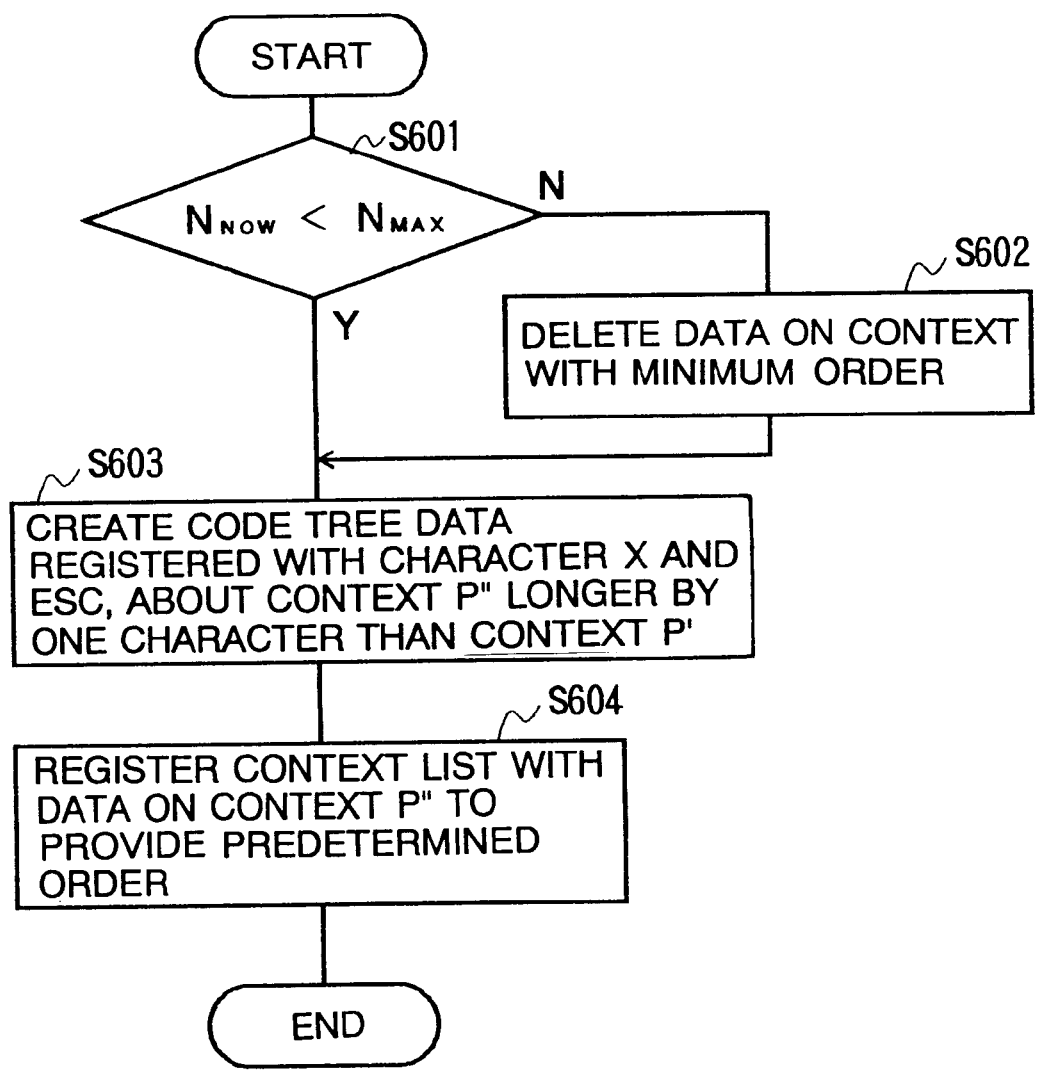
FIG. 9 is a flowchart showing operating procedures of the data compressing apparatus when executing a context registering process.

Hereinafter, the context registering process will be described in detail with reference to FIG. 9. According to the present data compressing apparatus, an upper limit is given to a total number of pieces of the code tree data registerable in the code tree data registration area. Therefore, when the code tree data to be registered newly occurs, as shown in FIG. 9, the CPU 13 at first determines whether or not a total number of $N_{NOW}$ of the code tree data at that time is less than an upper limit $N_{MAX}$ (step S601). Then, if the total number $N_{NOW}$ is not less than the upper limit $N_{MAX}$ (step S601; N), the code tree data relative to the context provided with the minimum order in the context order list is deleted out of the RAM (step S602).

Then, an item of code tree data on the context P" is created on the RAM (step S603). Note that on this occasion, the CPU 13 creates an item o code tree data relative to a code tree having two leaves pertaining to the character X and ESC. Subsequently, the CPU 13 registers the data on the context P" in the context order list so as to impart an order corresponding to ½ of the total number $N_{NOW}$ ($N_{NOW}$=$N_{MAX}$ in this case) (step S604), and finishes the context registering process (with a shift to step S512 in FIG. 8).

On the other hand, if the total number $N_{NOW}$ is less than the upper limit $N_{MAX}$ (step S601; Y), the CPU 13 registers the code tree data relative to the context P" without deleting the code tree data (steps S603 and S604), thus finishing the context registering process.

Referring back to FIG. 8, there will continue the explanation of the operation of the CPU 13 incorporated into the data compressing apparatus in the third embodiment.

After executing the context registering process, or when the context has the maximum order, the CPU 13 updates the context character string P by use of the character X (step S512). More specifically, the CPU 13, if the order of the context character string P is coincident with the maximum order $C_{MAX}$, a character string with an addition of the character X to a trail of the context character string is set as a new context character string. Further, if the order of the context character string P is coincident with the maximum order $C_{MAX}$, the character X is added to the trail of the context character string P, and a character string with a removal of one character from its head is set as a new context character string P.

Thereafter, the CPU 13, if the data that should be encoded are left (step S513; N), returns to step S502.

On the other hand, if the data pertaining to the leaf X' to be encoded does not exist in the code tree data detected in steps S504 and S505 (step S506; N), the CPU 13 outputs a code made corresponding to "ESC" in the code tree data (step S514). Thereafter, the CPU 13 updates the content of the code tree data for the context character string P' so that the leaf X' corresponding to the character X is added to the code tree relative to the context character string P' (step S516). Then, the CPU 13 proceeds to step S505.

As discussed above, according to the data compressing apparatus in the third embodiment, the encoding is carried out adaptively by use of the context. Further, each time a certain context is used, the order of the same context is changed to the first order, and hence the data deleted when registering the data relative to a new context becomes data having a small using frequency. Accordingly, the present data compressing apparatus compresses the data by effectively using a finite memory, and it is therefore possible to attain the data compression at a higher compression rate than by the prior art data compressing apparatus including the memory having the same capacity, which is employed for storing statistic data.

Note that when starting up the data compressing apparatus in the third embodiment, the apparatus may be, as a matter of course, constructed so that there are prepared the code tree data relative to the context of the first or second order in addition to the 0th order context. In the case of such a construction, the data compression is also attainable in the procedures shown in FIG. 7.

Further, the present data compressing apparatus, if the character to be encoded is not registered in the code tree pertaining to a certain context, outputs the code corresponding to the ESC and the code made corresponding to the relevant character by the code tree relative to the 0th order context. However, if the encoding target character is not registered in the code tree pertaining to a certain context, and when detecting the code tree registered with the encoding target character by sequentially decreasing the order of the context, the data compressing apparatus can be also constructed to output the code made corresponding to the encoding target character by the code tree. Incidentally, in this case, if the encoding target character is not registered in the code tree pertaining to each context with the decreased order, the data compressing apparatus is constructed to output only the code corresponding to ESC and to add the encoding target character to that code tree.

Further, the data compressing apparatus can be also constructed to provide the code tree concerning to the 0th order context with a leaf corresponding to ESC, to prepare a code tree for determining the code that should be outputted to the character which is not registered in the code tree relative to the 0th order context, and to thereby make it possible to add the character to the code tree pertaining to the 0th order context.

Figures 10A, 10B:
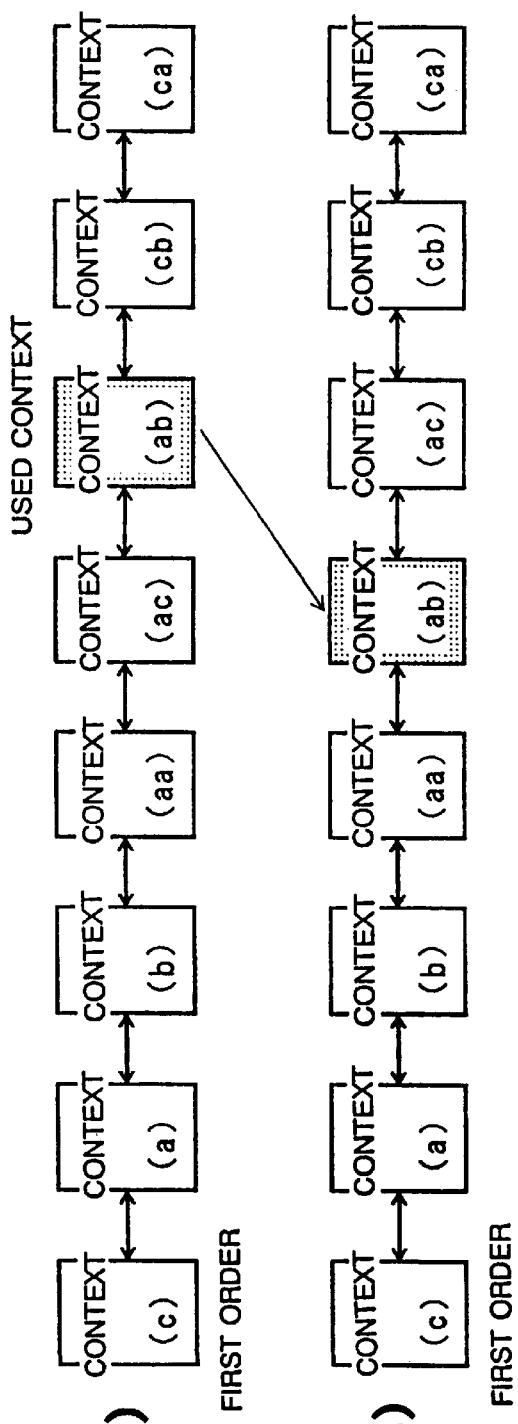
FIG. 10 is an explanatory diagram showing a processing procedure of the order changing process applicable to the data compressing apparatus in the third embodiment.

Moreover, the present data compressing apparatus is constructed to provide, if a certain context is used, this context with the first order. The procedure of updating the order of the context is not limited to this. For example, as schematically shown in FIG. 10, it is also possible to adopt such an updating procedure as to make the order of the used context higher by one. Moreover, the data compressing apparatus can be also constructed in such a manner that, as schematically shown in FIG. 11, the context order list is so structured as to be capable of storing the using frequencies of the respective contexts, and that the order corresponding to the using frequency thereof is given to each context.

<Data Restoring Apparatus>

A data restoring apparatus in the third embodiment restores the data compressed by the data compressing apparatus in the third embodiment. When starting up the data restoring apparatus in the third embodiment, a RAM thereof is stored with absolutely the same data as the data prepared on the RAM of the data compressing apparatus in the third embodiment.

Operating procedures of the CPU 13 within the data restoring apparatus in the third embodiment will hereinafter be described with reference to FIG. 12.

Figure 12:
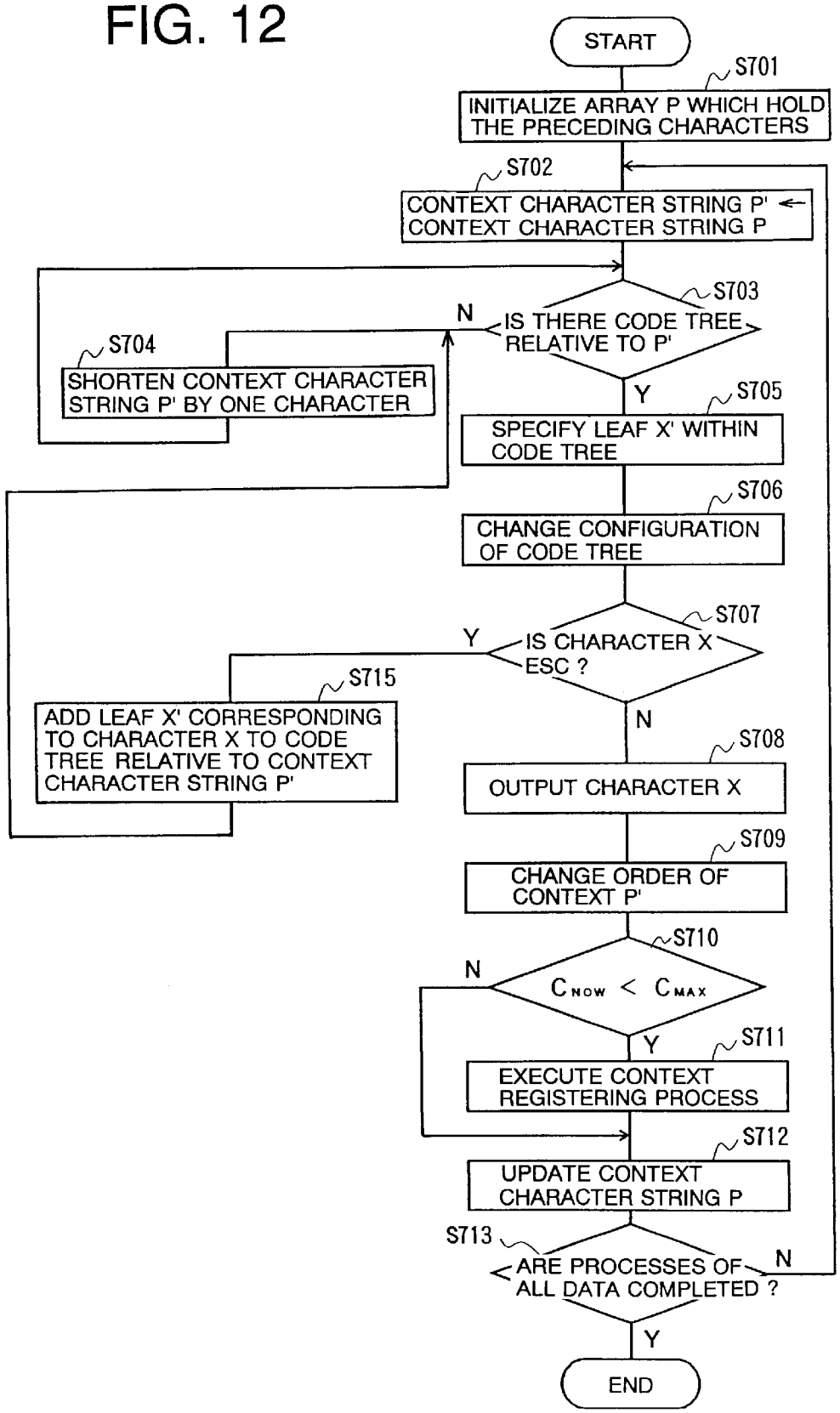
FIG. 12 is a flowchart showing operating procedures of a data restoring apparatus in the third embodiment of the present invention.

As shown in FIG. 12, when starting the restoration of the data, the CPU 13 at first initializes the context character string P by setting a null character string (step S701). Then, the CPU 13 generates a context character string P' having the same content as that of the context character string P (step S702).

Subsequently, the CPU 13 determines whether or not the code tree data on the context character string P' exists (step S703). If the code tree data relative to the context character string P' does not exist (step S703; N), the CPU 13 sets, as a new context character string P', the character string into which the context character string P' is shortened by one character (step S704). Then, the CPU 13 returns to step S703 and checks whether the code tree data relative to the context character string P' exists or not.

The CPU 13, after detecting the context P' having the code tree data, specifies the leaf X' made corresponding to the code to be decoded in the code tree data (step S705). Subsequently, the CPU 13 updates a content of the code tree data so as to reflect the fact that the leaf X' is used, in a configuration of the code tree (step S706).

Then, if the character X corresponding to the leaf X' is not ESC (step S707; N), the CPU 13 outputs the character X and changes the order of the context P' within the context list. This order is changed in the same procedure as step S509 shown in FIG. 7.

Thereafter, the CPU 13, if the order $C_{NOW}$ of the context P' is less than the maximum order $C_{MAX}$ ($C_{MAX}$=2) of the context (step S710; Y), executes absolutely the same context registering process as the context registering process that has been executed by the data compressing apparatus in the third embodiment in order to register the data relative to a context character P'' obtained by elongating the context character string P' by one character (step S711).

After executing the context registering process, the CPU 13 updates the context character string P by use of the character X (step S712) and, if the data that should be encoded are left (step S713; N), returns to step S702.

On the other hand, if the character X corresponding to the leaf X' is ESC (step S707; Y), the CPU 13 updates the content of the code tree data for the context character string P' so that the leaf X' corresponding to the character X is added to the code tree relative to the context character string P' (step S715) and proceeds to step S704.

Then, when there is no unprocessed character in the compressed data (step S713; Y), the CPU 13 finishes the data restoring process for the compressed data.

Note that the data restoring apparatus including the RAM stored with absolutely the same code tree data when started up is employed for the apparatus that starts the data compression in a state where several items of code tree data are stored in the RAM. When detecting the code tree registered with the encoding target character by sequentially decreasing the order of the context, a data restoring apparatus that will operate as follows is used for the data compressing apparatus constructed to output the code made corresponding to the encoding target character by that code tree. This data restoring apparatus, if the character corresponding to the code is defined as ESC, decodes subsequent codes by employing the code tree detected by decreasing the order of the context till the corresponding code tree is detected. Then, the data restoring apparatus repeats such decoding till a character that is not identical with ESC is decoded and, when detecting the character that is not identical with ESC, adds that character to the code tree used so far.

Fourth Embodiment

<Data Compressing Apparatus>

The data compressing apparatus in a fourth embodiment compresses the data in such a form that the Huffman coding is combined with the arithmetic coding.

Figure 13:
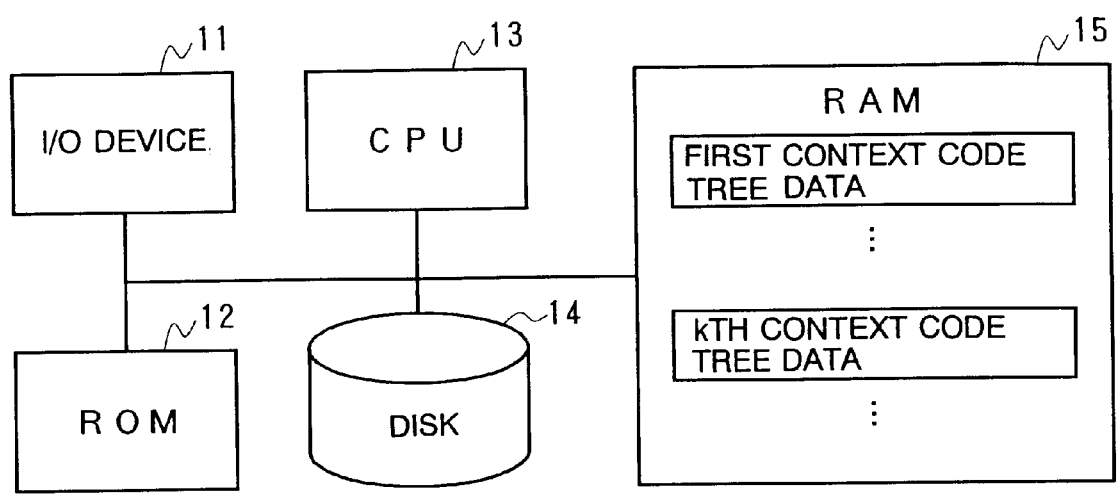
FIG. 13 is a block diagram showing a construction of the data compressing apparatus in a fourth embodiment of the present invention.

FIG. 13 illustrates a construction of the data compressing apparatus in the fourth embodiment. As schematically shown in FIG. 13, when starting up the data compressing apparatus in the fourth embodiment, the RAM is stored plural items of code tree data and a plurality of frequency lists.

Each item of code tree data is made corresponding to a context that is the second order or under, and the code tree represented by each item of code tree data has leaves concerning all the characters which might occur posterior to the corresponding context. Further, one of plural pieces of code tree data is code tree data for the 0th order context. Each frequency list is made corresponding to a third order context and stored with initial values of frequencies relative all the characters that might occur posterior to the corresponding context.

Figure 14:
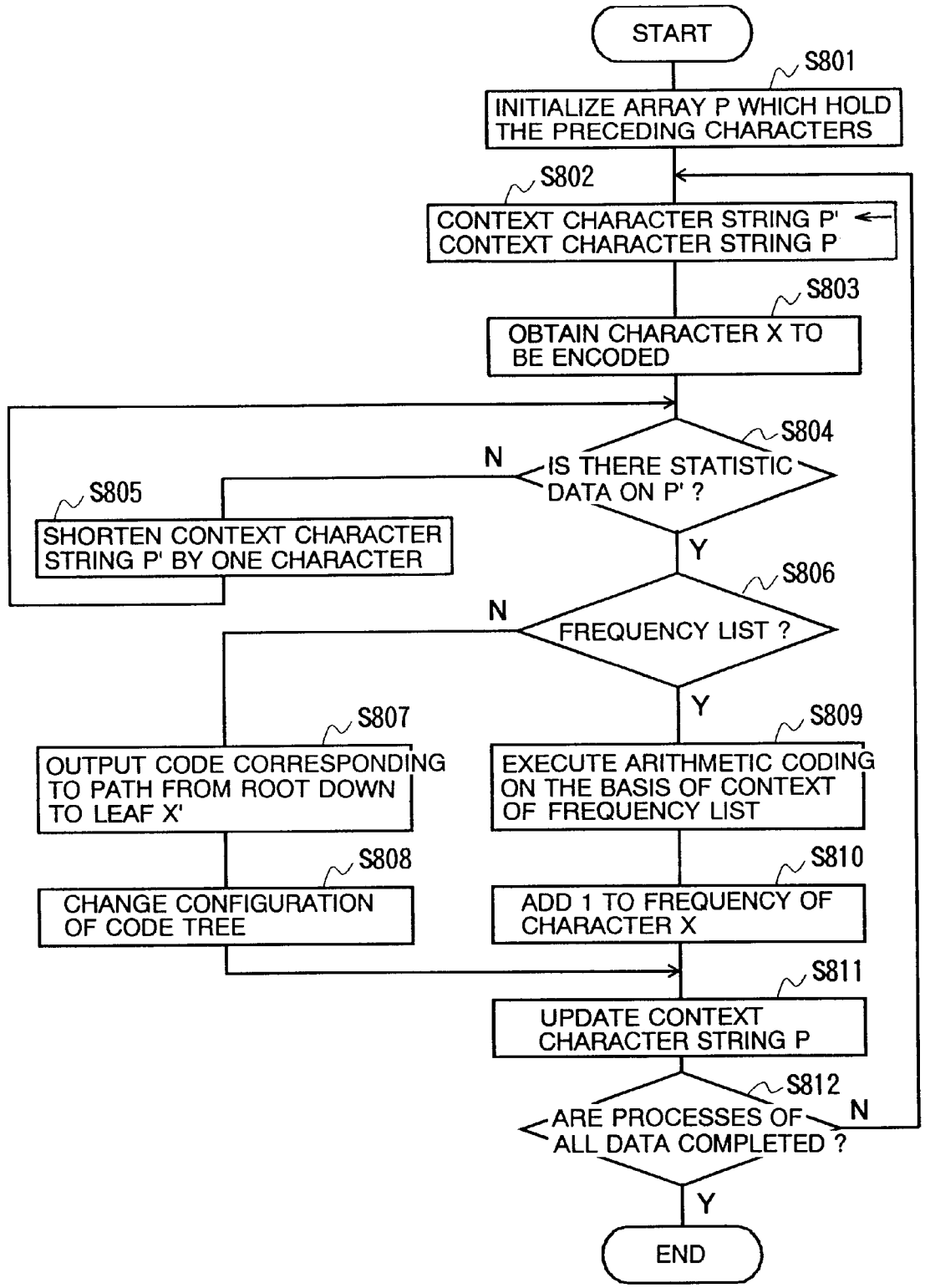
FIG. 14 is a flowchart showing operating procedures of the data compressing apparatus in a fourth embodiment of the present invention.

Operating procedures of the CPU 13 within the data compressing apparatus in the fourth embodiment when executing the data compression will be hereinafter explained with reference to FIG. 14.

When starting the data compression, the CPU 13 at first initializes the context character string P into a null character string (step S801). Next, the CPU 13 generates a context character string P' having the same content as that of the context character string P (step S802) and obtains the character X to be encoded from the original data that should be encoded (step S803). Then, the CPU 13 checks whether or not statistic data (the frequency list or the code tree data) pertaining to the context character string P' is held on the RAM. If not held (step S803; N), the character string P' is shortened by one character (step S805), and step S804 is reexecuted.

If the statistic data on the context P' determined in a loop formed by steps S804 and S805 is the code tree data (step S806; N), the CPU 13 outputs, as a code, a path extending from a root of the code tree defined by the code tree data corresponding to the context character string P' down to the leaf X' corresponding to the character X (step S807). Subsequently based on the fact that the character X occurs, a configuration of the code tree is modified by use of the FGK algorithm (step S808).

Thereafter, the CPU 13 updates the context character string P by use of the character X (step S811) and, if the data to be encoded are left (step S812; N), returns to step S802, wherein a next character is to be encoded.

Figure 15:
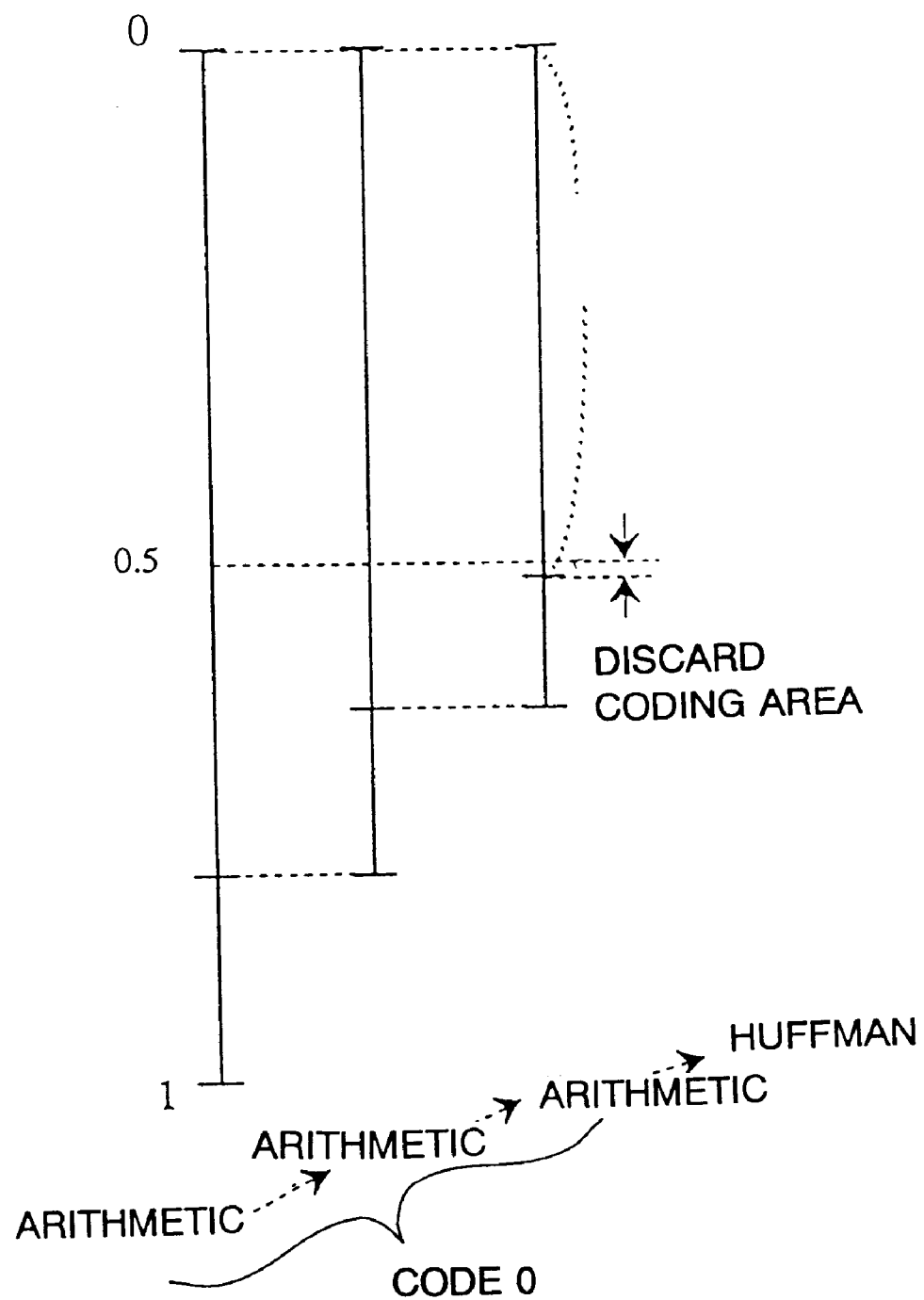
FIG. 15 is an explanatory diagram showing an arithmetic coding procedure by the data compressing apparatus in the fourth embodiment.

On the other hand, if the statistic data on the context P' determined in a loop formed by steps S803 and S804 is the frequency list (step S806; Y), the CPU 13 performs the arithmetic encoding of the character X by making use of this frequency list (step S809). In this step S809, the CPU 13 executes only a process of narrowing an interval in accordance with the character X and a process of storing the narrowed interval. Then, the CPU 13, when changing over the code to be outputted to a Huffman code, outputs an encoded result based on the arithmetic coding. That is, as schematically shown in FIG. 15, the CPU 13 fetches (discards a fraction area) bit strings necessary and sufficient for decoding out of the data for defining the interval obtained by the arithmetic coding when changing over the output to be outputted to the Huffman code while narrowing the interval on the basis of each character, and outputs these bit strings.

After executing the arithmetic coding (step S809), the CPU 13 adds "1" to the frequency relative to the character X in the used frequency list (step S811) and, at the stage of completing the processes for all the data (step S812; Y), finishes the data compressing process.

Thus, according to the data compressing apparatus in the fourth embodiment, the arithmetic coding is performed for the high-order context with a large occurrence probability distribution of the character, while the Huffman coding is effected for the low-order context with a small occurrence probability distribution of the character. Therefore, the data compressing apparatus in the fourth embodiment is capable of attaining a high compression rate at a practical processing speed.

Incidentally, in the data compressing apparatus in accordance with the fourth embodiment, whether the code tree data or the frequency list should be prepared is determined depending on the order of the context. It is, however, a matter of course that the code tree data may be prepared for such a context that the occurrence probability of each character is small in terms of a difference from a power of ½, and that the frequency list may be prepared for such a context that the occurrence probability of each character is large in terms of the difference from the power of ½. Further, the code tree data may also be prepared for such a context that a predetermined or larger number of characters might occur, while the frequency list may be prepared for such a context that a less than predetermined number of characters might occur.

Then, the data compressing apparatus in the fourth embodiment is constructed so that the fraction area is discarded just when switched over to the Huffman coding but may also be constructed so that the faction area is discarded each time. In this case, however, it follows that the compression rate slightly decreases.

Figure 16:
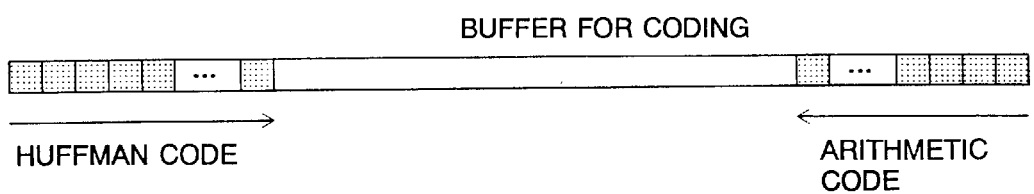
FIG. 16 is a schematic diagram showing a code storage method applicable to the data compressing apparatus in the fourth embodiment.

Further, as schematically shown in FIG. 16, the data compressing apparatus can be also constructed so that the codes generated by the Huffman coding are stored in a sequence from the front part of a code buffer (one area of the RAM) and that the codes generated by the arithmetic coding are stored in sequence from the rear part of the code buffer. Further, the data compressing apparatus can be also constructed so that two kinds of code buffers are provided, and the codes generated by the Huffman coding and by the arithmetic coding are outputted respectively to the separate code buffers.

As described above, if the apparatus is constructed so that the Huffman codes and the arithmetic codes are stored in separate storage areas, there is reduced the number of times with which the fraction area must be discarded when encoding one piece of data, whereby a high compression rate can be obtained.

<Data Restoring Apparatus>

A data restoring apparatus in the fourth embodiment restores the data compressed by the data compressing apparatus in the fourth embodiment. When starting up the data restoring apparatus in the fourth embodiment, a RAM thereof is stored with absolutely the same code tree data and the frequency list as the code tree data and the frequency list that are prepared on the RAM of the data compressing apparatus in the fourth embodiment.

Figure 17:
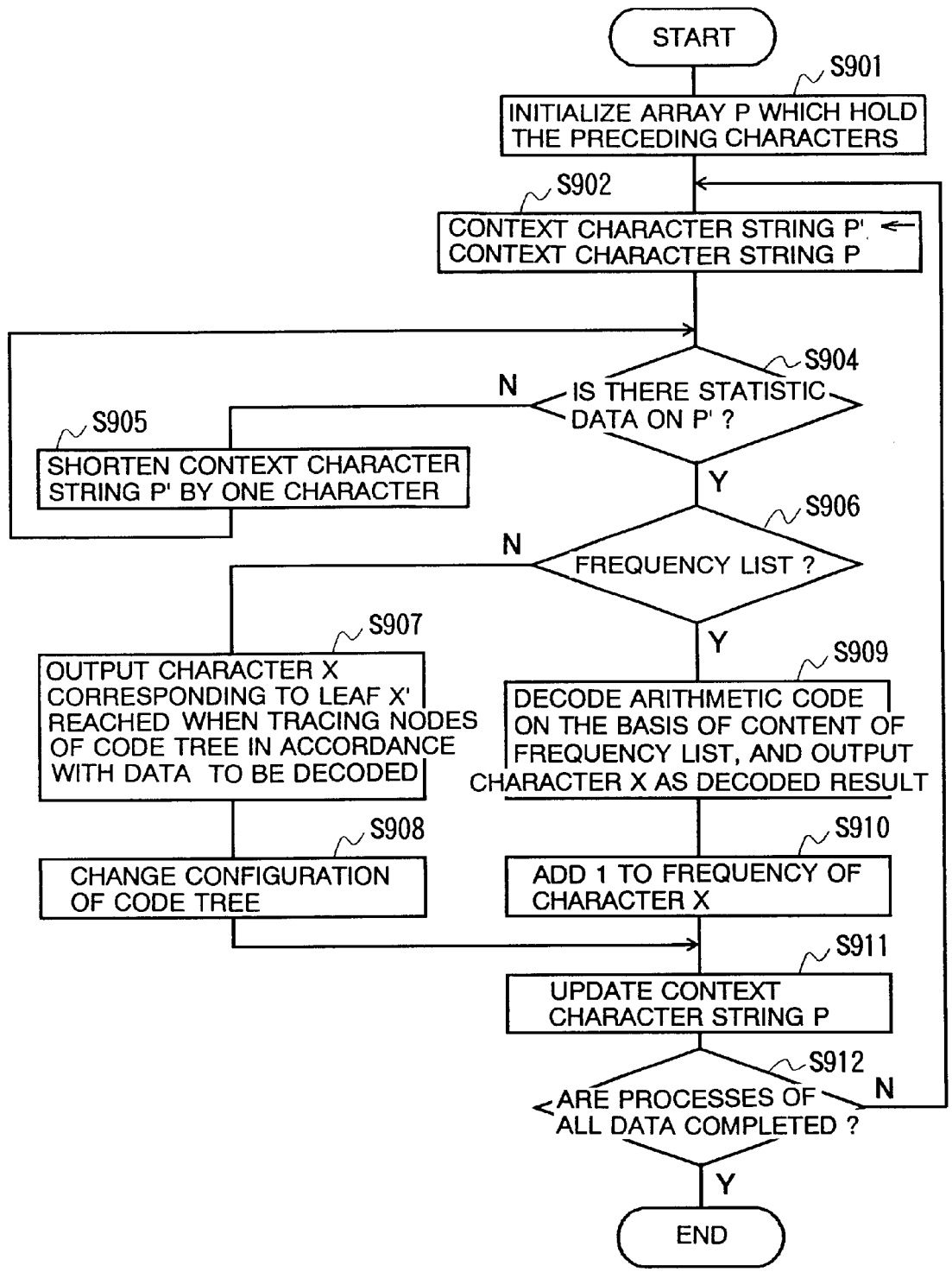
FIG. 17 is a flowchart showing operating procedures of the data restoring apparatus in the fourth embodiment of the present invention.

FIG. 17 shows operating procedures of the CPU 13 within the data restoring apparatus in the fourth embodiment when executing the data restoring process.

As shown in FIG. 17, when starting the restoration of the data, the CPU 13 at first initializes the context character string P (step S901). Subsequently, the CPU 13 generates the context character string P' having the same content as that of the context character string P (step S902). Then, the CPU 13 determines whether or not statistic data (the frequency list or the code tree data) pertaining to the context character string P' is held on the RAM. If not held (step S903; N), the character string P' is shortened by one character with an elimination of a head character therefrom (step S905), and step S904 is reexecuted.

If the statistic data on the context P' determined in a loop formed by steps S904 and S905 is the code tree data (step S906; N), the CPU 13 specifies one leaf X' by tracing the respective nodes within the code tree represented by the code tree data corresponding to the context character string P', from a root down to a leaf in accordance with values of respective bits constituting the data to be restored, and outputs the character X stored corresponding to the specified leaf X' as a restored result (step S907).

Thereafter, the CPU 13 updates the content of the code tree data relative to the context character string P' so as to reflect the fact that the character X occurs, in a configuration of the code tree (step S908). Then, the CPU 13 updates the context character string P by use of the character X (step S909) and, if the data to be restored are left (step S911; N), returns to step S902.

On the other hand, if the statistic data on the context P' determined in the loop formed by steps S904 and S905 is the frequency list (step S906; Y), the CPU 13 restores the data by making use of that frequency list (step S909). That is, the CPU 13 restores one character by using the code consisting of a proper number of pieces of bit data and stores a calculated result (which is numerical value data for specifying an interval) obtained in the restoring step. Then, if the arithmetic code is employed for a next character, the CPU 13 performs restoring by making use of even the calculated result stored therein. On the other hand, if the Huffman code is used for the next character, the CPU 13 recognizes a boundary between the arithmetic code and the Huffman code on the basis of the calculated result, and restores the bit data posterior to that boundary by making use of the code tree data.

The CPU 13, after the restoring of the arithmetic coding is completed for one character, adds "1" to the frequency relative to the character X in the used frequency list (step S910). Then, the CPU 13 determines whether the unprocessed data exist or not, and, if the processes of all the data have been completed (step S911; Y), the restoring process comes to an end.

Incidentally, according to the data restoring apparatus used for the data compressing apparatus for storing the separate storage areas with the Huffman codes and the arithmetic codes, the process in step S907 is effected on the data stored in one storage area, while the process in step S909 is effected on the data stored in the other storage area.

Fifth Embodiment

<Data Compressing Apparatus>

Figure 18:
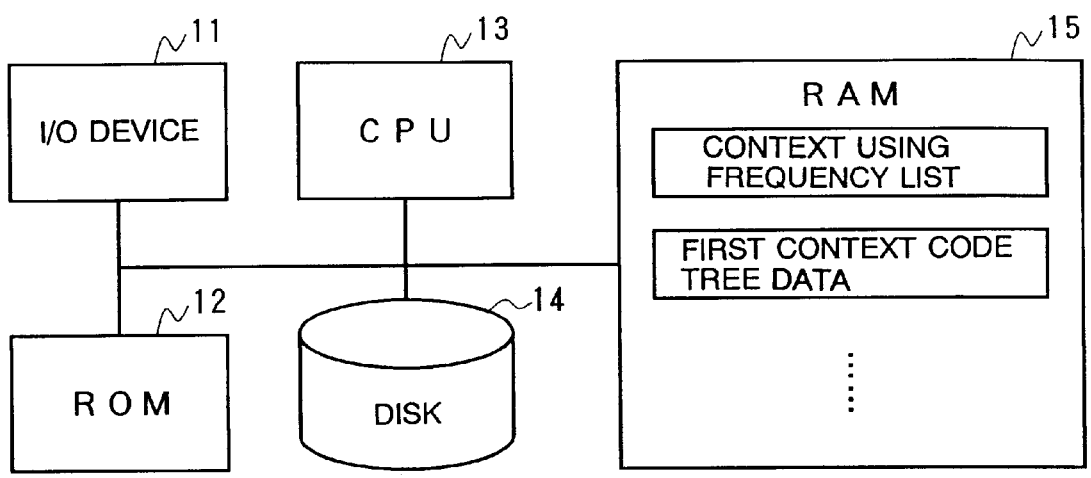
FIG. 18 is a block diagram showing a construction of the data compressing apparatus in the fourth embodiment of the present invention.

FIG. 18 illustrates a construction of the data compressing apparatus in a fifth embodiment. As depicted in FIG. 18, when starting up this data compressing apparatus, the RAM 15 is stored with plural items of code tree data corresponding to contexts of second or lower orders and a context using frequency list. Each item of code tree data includes data relative to all the characters that might occur posterior to a corresponding context, and one of plural pieces of code tree data is the code tree data for the 0th order context. The context using frequency list is a list for storing the using frequency of the code tree data concerning to each context. The context using frequency list prepared when started up is stored with a using frequency "0" for all the contexts.

Figure 19:
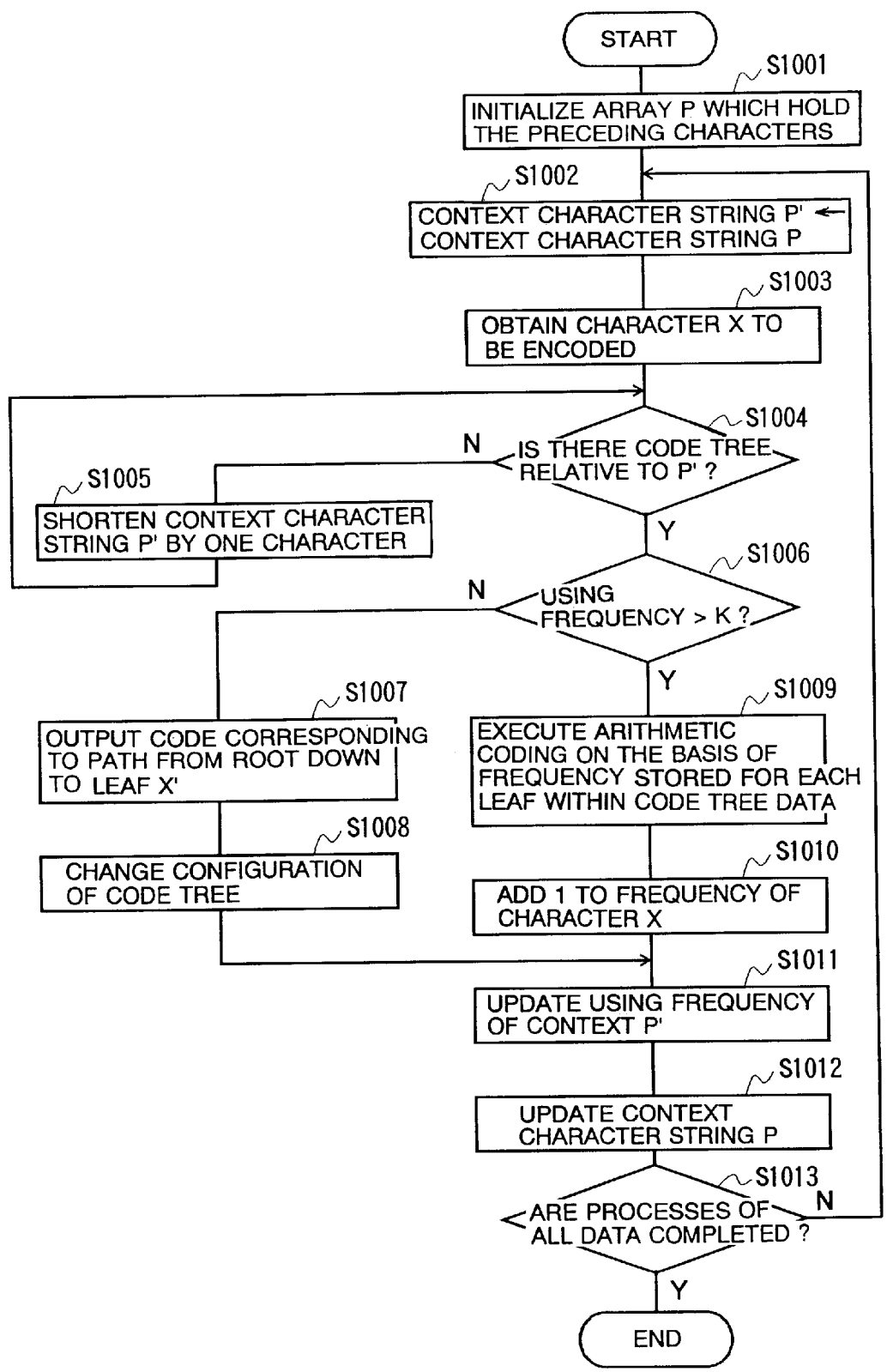
FIG. 19 is a flowchart showing operating procedures of the data compressing apparatus in a fifth embodiment of the present invention.

FIG. 19 shows operating procedures of the CPU 13 within the data compressing apparatus in the fifth embodiment.

When starting the data compression, the CPU 13 at first initializes the context character string P into a null character string (step S1001). Next, the CPU 13 generates a context character string P' having the same content as that of the context character string P (step S1002) and obtains the character X to be encoded out of the data that should be encoded (step S1003). Then, the CPU 13 determines whether or not the code tree data on the context character string P' is held on the RAM. If not held (step S1004; N), the character string P' is shortened by one character with a removal of the heard one character therefrom (step S1005), and step S1004 is reexecuted.

The CPU 13 determines the context character string P' where the code tree data exists from a loop formed by steps S100 and S1005 (step S100; Y) and thereafter, obtains a using frequency relative to a context thereof with reference to a content of the context using frequency list. Then, the CPU 13 makes a comparison of magnitude between the thus obtained using frequency and a predetermined value K (step S1006). Then, if the using frequency is K or under (step S1006; N), the CPU 13 outputs, as a code, a path extending from a root of the code tree defined by the code tree data corresponding to the context character string P' down to a leaf X' corresponding to the character X (step S1007). Subsequently, the CPU 13 increments an occurrence frequency of the character X and changes the content of the code tree data so that the code tree assumes a configuration corresponding to each occurrence frequency (step S1008).

Thereafter, the CPU 13 adds "1" to the using frequency concerning to the used context (step S1011) and updates the context character string P by use of the character X (step S1012). That is, the CPU 13, when the order of the context character string P is coincident with 2 (which the maximum order in the present apparatus), adds the character X to the trail of the context character string P and removes one character from the head thereof, thus generating a new context character string P. Further, if the order of the context character string P is 1 or under, the character string having its trail to which the character is added is set as a new context character string P.

Thereafter, the CPU 13 determines whether or not the data to be encoded are left. If left (step S1013; N), the CPU 13 goes back to step S1002, wherein a next character is encoded.

On the other hand, if the using frequency relative to the context coincident with the context exceeds K (step S1006; Y), the CPU 13 performs the arithmetic coding of the character X by using the occurrence frequency stored for each leaf (step S1009). The arithmetic coding procedure in step S1009 is the same in the data compressing apparatus in the fourth embodiment. Subsequently, the CPU 13 adds "1" to the using frequency concerning to the character X of the used code tree data (step S1011) and proceeds to step S1012.

Then, the CPU 13 determines whether or not the processes for all the characters are completed. If completed (step S1013; Y), the data compressing process comes to an end.

Thus, according to the data compressing apparatus in the fifth embodiment, the data are encoded based on the Huffman coding at a stage with a less using frequency (which implies that the statistic data are not yet collected), and there starts the encoding based on the arithmetic coding at a stage with an increased using frequency. Therefore, according to the present data compressing apparatus, the data can be compressed at a high efficiency.

Incidentally, the apparatus can be constructed so that K is set to a value proportional to a total number of encoded characters, whereby the Huffman coding is carried out when a rate of the occurrence frequency to the total number of characters is small, and the arithmetic coding is effected when the rate of the occurrence frequency of the total number of characters is large.

<Data Restoring Apparatus>

A data restoring apparatus in the fifth embodiment restores the data compressed by the data compressing apparatus in the fifth embodiment. When starting up the data restoring apparatus in the fifth embodiment, a RAM thereof is stored with absolutely the same code tree data and the same context using frequency list as the code tree data and the context using frequency list that are prepared on the RAM of the data compressing apparatus in the fifth embodiment.

Figure 20:
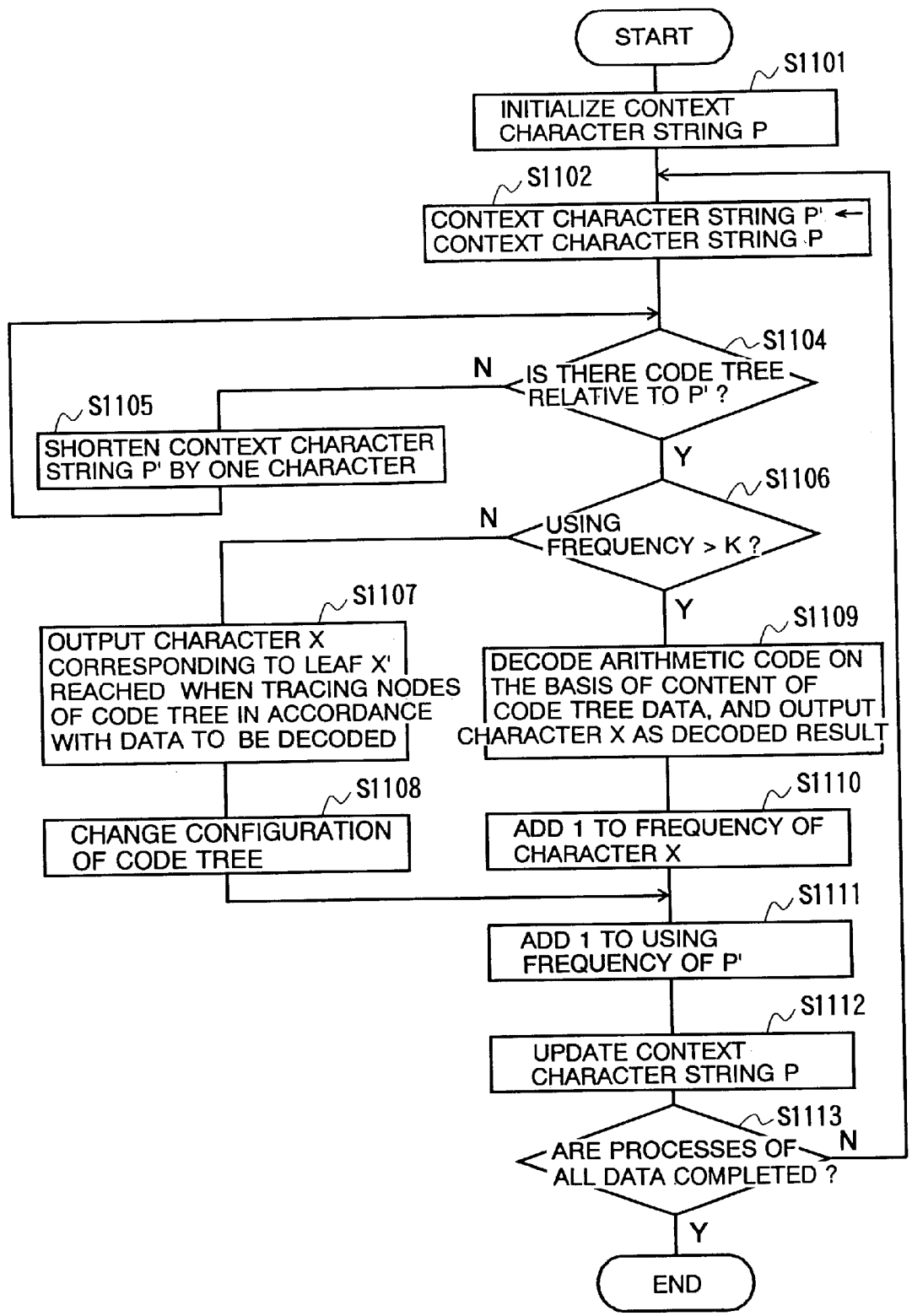
FIG. 20 is a flowchart showing operating procedures of the data restoring apparatus in the fifth embodiment of the present invention.
Figure 21:
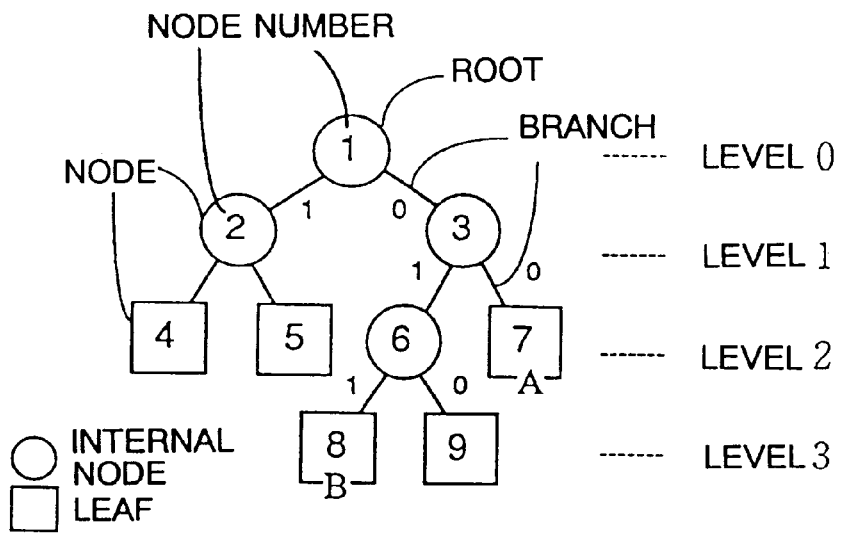
FIG. 21 is an explanatory diagram showing a code tree.
Figure 22:
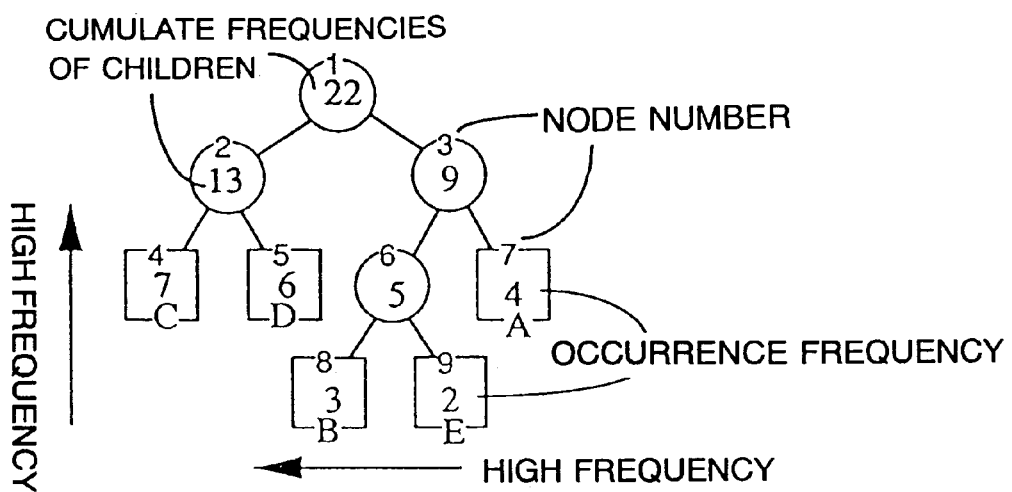
FIG. 22 is an explanatory diagram showing a Huffman code tree to which a FGK algorithm is applicable.
Figures 23, 24:
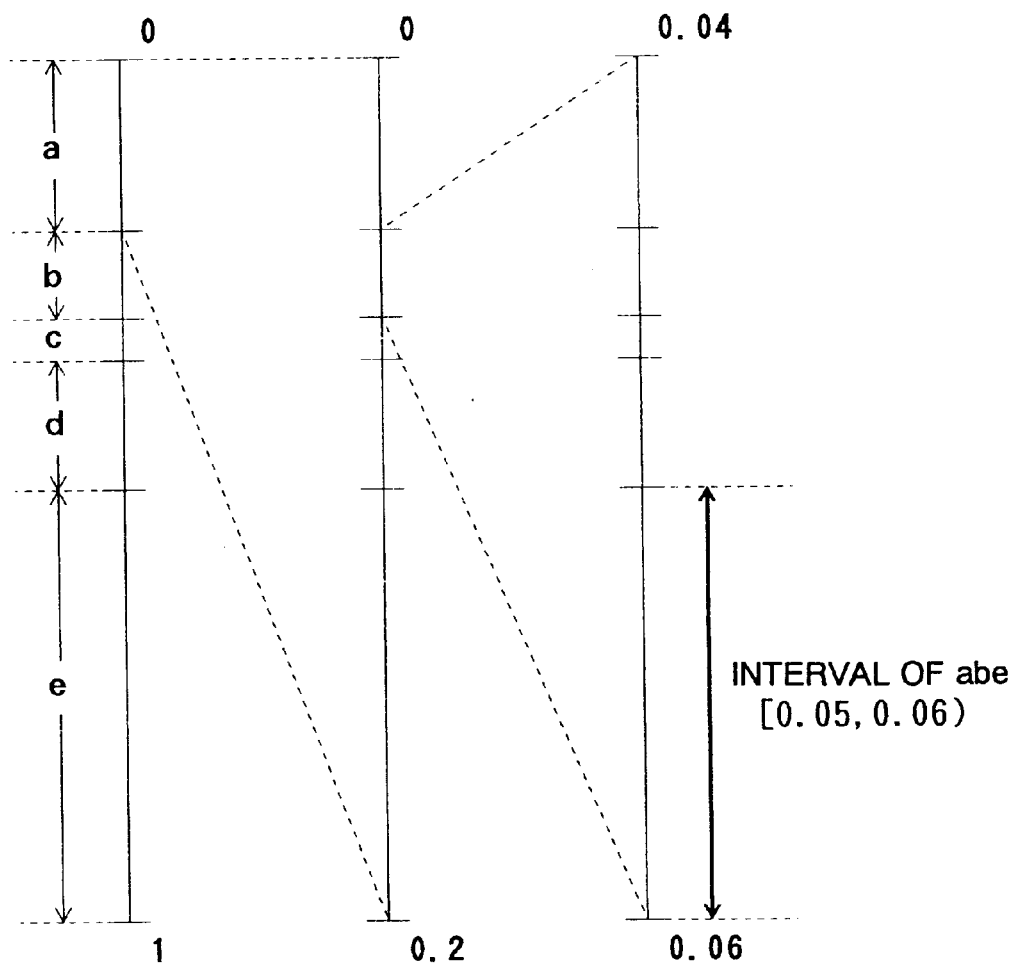
FIG. 23 is a character/occurrence probability/interval corresponding table of assistance in explaining arithmetic coding.
FIG. 24 is a schematic diagram of assistance in explaining arithmetic coding with an application of a context model.
Figure 25:
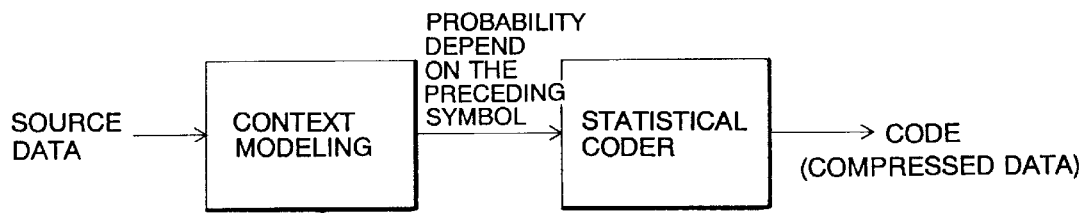
FIG. 25 is a diagram showing one example of a context tree.
Figure 26:
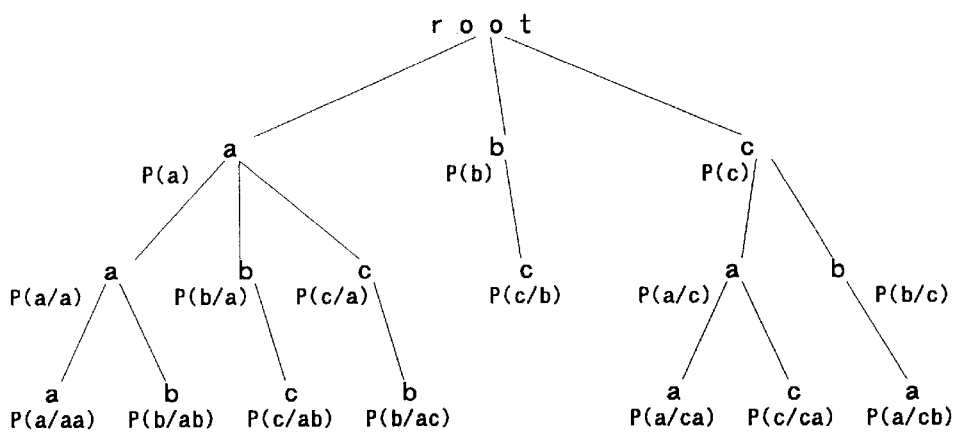
FIG. 26 is a diagram showing one example of a context tree.
Figure 27:
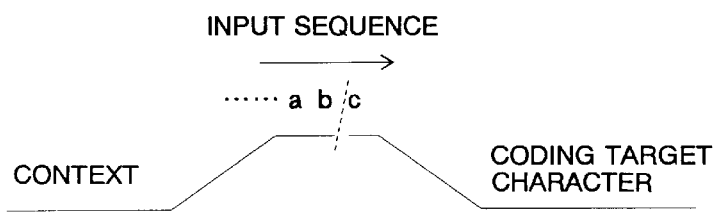
FIG. 27 is a diagram showing a relationship between a context and a coding target character.

FIG. 20 shows operating procedures of the data restoring apparatus in the fifth embodiment.

As shown in FIG. 20, when starting the restoration of the data, the CPU 13 at first initializes the context character string P (step S1101). Subsequently, the CPU 13 generates the context character string P' having the same content as that of the context character string P (step S1102). Then, the CPU 13 determines whether or not the code tree data relative to the context character string P' is held on the RAM. If not held (step S110; N), the character string P' is shortened by one character with an elimination of a head character therefrom (step S1105), and step S1104 is reexecuted.

When detecting the code tree data pertaining to the context character string P' (step S1104), the CPU 13 obtains a using frequency of the code tree data by referring to a content of the context using frequency list, and makes a comparison of magnitude between the using frequency and the predetermined value K (step S1106). Then, if the using frequency is K or under (step S1106; N), the CPU 13 specifies one leaf X' by tracing the respective nodes within the code tree represented by the code tree data corresponding to the context character string P', from a root down to a leaf in accordance with values of respective bits constituting the data to be restored, and outputs the character X stored corresponding to the specified leaf X' as a restored result (step S1107.

Thereafter, the CPU 13 updates the content of the code tree data relative to the context character string P' so as to reflect the fact that the occurrence frequency of the character X increases, in a configuration of the code tree (step S1108). Next, the CPU 13 adds "1" to the using frequency relative to that context (step S1011).

Then, the CPU 13 updates the context character string P by use of the character X (step S1112) and, if the data to be restored are left (step S1113; N), returns to step S1102.

On the other hand, if the using frequency of the code tree data pertaining to the context character string P' is larger than the predetermined value K (step S1106; Y), the CPU 13 performs the decoding by treating the restoration target bit string as arithmetic codes, and outputs the character X conceived as a decoded result (step S1109). When decoded, the CPU 13 uses the using frequency of each character within the code tree data relative to the context character string P' as data for allocating an interval between the respective characters.

Subsequently, the CPU 13 adds "1" to the occurrence frequency of the character X within the used code tree data (step S1110) and updates the content of the code tree data pertaining to the context character string P' (step S1108). Next, the CPU 13 adds "1" to the using frequency corresponding to the context character string P' within the context using frequency list (step S1011) and updates the context character string P by use of the character X (step S1112). Then, the CPU 13 determines whether or not the data to be processed are left, and, when completing the processes for all the data (step S1113; Y), the restoring process is finished.

As discussed above, the data coding apparatus according to the present invention is capable of encoding the data at the high compression rate at the high speed. Further, the data restoring apparatus according to the present invention is capable of restoring the data compressed by the data coding apparatus of the present invention at the high speed.

It is apparent that, in this invention, a wide range of different working modes can be formed based on the invention without deviating from the spirit and scope of the invention. This invention is not restricted by its specific working modes except being limited by the appended claims.

What is claimed is:

1. A data compression apparatus comprising:
    storage means for storing contexts and code trees according to a Huffman code rule, each of the code trees is related to a context;
    input means for inputting a character string to be compressed;
    character obtaining means for obtaining a character to be encoded from the inputted character string;
    context specifying means for specifying a context occurred just preceding to the character obtained by said character obtaining means;
    code outputting means for outputting a code corresponding to the character obtained by said character obtaining means in the code tree with respect to the context specified by said context specifying means;
    updating means for updating the code tree used by said code outputting means in accordance with the Huffman code rule,
    wherein
        each of the code trees contains a special code 'escape' which is transmitted to signal a decoder to shorten the context,
        if the data relative to the character obtained by said character obtaining means does not exist in the code tree stored in said storage means with respect to the context specified by said context specifying means, said code outputting means outputs the special code 'escape' within the code tree and repeats the outputting of the special code 'escape' while shortening the context until the code for the character related to the context is found, and outputs the code of the character; and
        adding means for adding data about unregistered combinations of character and contexts to said storage means when said code outputting means outputs the special code 'escape'.

2. A data compression apparatus according to claim 1, further comprising:
    using frequency managing means for managing a using frequency of each context by said code outputting means; and
    deleting means for deleting data about a context with a minimum using frequency out of said storage means.

3. A data compression apparatus according to claim 1, further comprising:
    degree managing means for managing degrees related to the contexts respectively and, when said code outputting means outputs the code, imparting a higher degree to the context used for outputting the code;
    deleting means for deleting data about a context to which a lowest degree is imparted from within said storage means.

4. A data compression apparatus according to claim 1, wherein said degree managing means imparts a first degree to the context used for said code outputting means.

5. A data compression apparatus according to claim 1, wherein said degree managing means imparts a degree higher by one to the context used for said code outputting means.

6. A data compression apparatus comprising:
    storage means for storing code trees according to a Huffman code rule and an occurrence frequency table, each of the code trees and the occurrence frequency table is related to a context;
    input means for inputting a character string to be compressed;
    character obtaining means for obtaining a character to be encoded from the inputted character string;
    context specifying means for specifying a context that occurs just preceding to the character obtained by said character obtaining means;
    first code outputting means for outputting, if data stored in said storage means for the context specified by said context specifying means is a code tree, a code corresponding to the character obtained by said character obtaining means in that by the code tree;
    first updating means for updating the code tree used by said first code outputting means in accordance with the Huffman code rule;
    second code outputting means for calculating, if data stored in said storage means for the context specified by said context specifying means is the occurrence frequency table, a code of the character obtained by said character obtaining means based on arithmetic coding rules using the occurrence frequency table, and for outputting the code; and
    second updating means for increasing occurrence frequency relative to the character obtained by said character obtaining means within the occurrence frequency table used by said second code outputting means.

7. A data compression apparatus according to claim 6, wherein each of the code trees stored in said storage means are data for a context such that the divergence of each character's probability from multiplication of ½ is small, and
    each of the occurrence frequency table is used for such a context that the divergence of each character's probability from multiplication of ½ is big.

8. A data compression apparatus according to claim 6, wherein each of the code trees stored in said storage means is data for such a context that order is less than a predetermined value, and each of the occurrence frequency table is data for such a context that order is the predetermined value or larger.

9. A data compression apparatus according to claim 6, wherein each of the code tree stored in said storage means is made corresponding to such a context that a predetermined or larger number of characters occur following the context, and each of the occurrence frequency table is made corresponding to such a context that a less than the predetermined number of characters occur following the context.

10. A data compression apparatus according to claims 6, wherein said second code outputting means outputs a fraction of the code as a theretofore encoded result when said first code outputting means outputs the code.

11. A data compression apparatus according to claim 6, further comprising:

code storage means having first and second storage areas stored with the codes as compressed results, wherein said first code outputting means writes the code to said first storage area within said code storage means, and said second code outputting means writes the code to said second storage area within said code storage means.

12. A data compression apparatus according to claim 6, further comprising:

code storage means having a storage area of a predetermined size, stored with the code as a compressed result; and code outputting means for outputting the code stored in said storage means when said code storage means is incapable of storing a new code, wherein said first code outputting means writes the codes to said storage area within said code storage means from a front part thereof, and said second code outputting means writes the codes to said storage area within said code storage means from a rear part thereof.

13. A data decompression apparatus comprising:

storage means for storing contexts and code trees according to a Huffman code rule, each of the code trees is related to a context;

context specifying means for specifying a context to be used for restoring data;

character outputting means for outputting a character corresponding to the code in the code tree stored in said storage means with respect to the context specified by said context specifying means;

updating means for updating the code tree used by said character outputting means in accordance with the Huffman code rule, wherein each of the code trees contains a special code 'escape', and if the code is the special code in the code tree is the special character, said character outputting means repeats the restoration while shortening the context until the character is restored; and registering means for registering said storage means with data about unregistered combinations of contexts and character.

14. A data decompression apparatus according to claim 13, further comprising:

using frequency managing means for managing a using frequency of each context by said character outputting means; and deleting means for deleting data about a context with a minimum using frequency out of said storage means.

15. A data decompression apparatus according to claim 13, further comprising:

degree managing means for managing degrees by imparting a degree to each context and, when said character outputting means outputs the character, imparting a higher degree to the context used for outputting the character and;

deleting means for deleting data about a context to which a lowest degree is imparted from within said storage means.

16. A data decompression apparatus according to claim 15, wherein said degree managing means imparts a first order to the context used for said code outputting means.

17. A data decompression apparatus according to claim 15, wherein said degree managing means imparts a degree higher by one to the context used for said code outputting means.

18. A data decompression apparatus comprising:

storage means for storing code trees according to a Huffman code rule and an occurrence frequency table, each of the code trees and occurrence frequency table is related to a context;

context specifying means for specifying a context used for decoding;

first character outputting means for outputting, if data stored in said storage means for the context specified by said context specifying means is a code tree, a character made corresponding to the code in that code tree;

first updating means for updating the code tree used by said first character outputting means in accordance with the Huffman code rule;

second character outputting means for performing, if data stored in said storage means for the context specified by said context specifying means is the occurrence frequency table, arithmetic decoding of the code on the basis of the occurrence frequency table and outputting the character obtained as a decoded result; and second updating means for increasing the occurrence frequency relative to the outputted character in the occurrence frequency table used by said second character outputting means.

19. A data decompression apparatus according to claim 18, wherein the code tree stored in said storage means is data for such a context that the divergence of each character's from multiplication of ½ is small, and the occurrence frequency table is data for such a context that the divergence of each character's from multiplication of ½ is big.

20. A data decompression apparatus according to claim 18, wherein the code tree stored in said storage means is data for such a context that a order is less than a predetermined value, and the occurrence frequency table is data for such a context that the order is the predetermined value or larger.

21. A data decompression apparatus according to claim 18, wherein the code tree stored in said storage means is made corresponding to such a context that a predetermined or larger number of characters occur following the context, and the occurrence frequency table is made corresponding to such a context that a less than the predetermined number of characters occur following the context.

22. A data decompression apparatus according to claim 17, wherein said second character outputting means removes fractions of the theretofore arithmetic codes when said first character outputting means performs the decoding.

23. A data decompression apparatus according to claim 18, further comprising:

code storage means having first and second storage areas stored with the codes to be restored, wherein said first character outputting means restores the code stored in said first storage area within said code storage means, and said second character outputting means restores the code stored in said second storage area within said code storage means.

24. A data decompression apparatus according to claim 18, further comprising:

code storage means having a storage area of a predetermined size, stored with the code as a compressed result; and code inputting means for inputting a new code into said code storage means when there is no code to be decoded within said code storage means, wherein said first character outputting means decodes the codes from the front part of said storage area within said code storage means, and said second character outputting means decodes the codes from the rear part of said storage area within said code storage means.

* * * * *